United States Patent
Shimizu et al.

(10) Patent No.: US 10,153,347 B2
(45) Date of Patent: Dec. 11, 2018

(54) SEMICONDUCTOR DEVICE, POWER SUPPLY CIRCUIT, COMPUTER, AND METHOD OF MANUFACTURING SEMICONDUCTOR DEVICE

(71) Applicant: Kabushiki Kaisha Toshiba, Minato-ku (JP)

(72) Inventors: Tatsuo Shimizu, Shinagawa (JP); Hisashi Saito, Kawasaki (JP); Hiroshi Ono, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/695,292

(22) Filed: Sep. 5, 2017

(65) Prior Publication Data
US 2018/0204916 A1    Jul. 19, 2018

(30) Foreign Application Priority Data
Jan. 17, 2017    (JP) .................................. 2017-005807

(51) Int. Cl.
*H01L 29/40* (2006.01)
*H01L 29/20* (2006.01)
(Continued)

(52) U.S. Cl.
CPC ........ *H01L 29/408* (2013.01); *H01L 29/2003* (2013.01); *H01L 29/205* (2013.01); *H01L 29/66462* (2013.01); *H01L 29/7787* (2013.01)

(58) Field of Classification Search
CPC ............... H01L 29/408; H01L 29/2003; H01L 29/205; H01L 29/66462; H01L 29/7787
See application file for complete search history.

(56) References Cited

U.S. PATENT DOCUMENTS 8,846,479 B2    9/2014 Kanamura
2002/0094624 A1*    7/2002 Ahn ........................ H01L 28/40
                                                                          438/200
(Continued)

FOREIGN PATENT DOCUMENTS

JP    2011-198837    10/2011
JP    5301208    9/2013
(Continued)

OTHER PUBLICATIONS

Kenta Watanabe, et al., "SiO$_2$/AlON stacked gate dielectrics for AlGaN/GaN MOS-HEMT," 2016, The 63th Japan Society of Applied Physics Spring Meeting, 2 Pages ( with English translation).

*Primary Examiner* — Sitaramarao S Yechuri
(74) *Attorney, Agent, or Firm* — Oblon, McClelland, Maier & Neustadt, L.L.P.

(57) ABSTRACT

A semiconductor device includes a first nitride semiconductor layer containing Ga, a second nitride semiconductor layer provided on the first nitride semiconductor layer containing Ga, a first electrode and a second electrode provided on or above the first nitride semiconductor layer and electrically connected to the first nitride semiconductor layer, a gate electrode provided between the first electrode and the second electrode, a conductive layer provided on or above the second electrode, of which a first distance to the second electrode is smaller than a second distance between the second electrode and the gate electrode, and which is electrically connected to the first electrode or the gate electrode, a first aluminum oxide layer provided between the gate electrode and the second electrode and provided between the second nitride semiconductor layer and the conductive layer, a silicon oxide layer, and a second aluminum oxide layer.

26 Claims, 26 Drawing Sheets

(51) Int. Cl.
*H01L 29/66* (2006.01)
*H01L 29/778* (2006.01)
*H01L 29/205* (2006.01)

(56) References Cited

U.S. PATENT DOCUMENTS

| | | | | |
|---|---|---|---|---|
| 2010/0273318 | A1* | 10/2010 | Melnik | C23C 16/0272 |
| | | | | 438/479 |
| 2011/0297958 | A1* | 12/2011 | Kub | H01L 29/1602 |
| | | | | 257/76 |
| 2013/0228790 | A1* | 9/2013 | Yamamura | H01L 29/2003 |
| | | | | 257/76 |
| 2013/0256686 | A1* | 10/2013 | Kanamura | H01L 29/205 |
| | | | | 257/76 |
| 2014/0092637 | A1* | 4/2014 | Minoura | H01L 29/408 |
| | | | | 363/17 |
| 2014/0146842 | A1* | 5/2014 | Avramescu | H01S 5/02461 |
| | | | | 372/44.01 |
| 2016/0043184 | A1* | 2/2016 | Zhang | H01L 29/402 |
| | | | | 257/77 |
| 2016/0260827 | A1* | 9/2016 | Nishimori | H01L 21/3245 |
| 2016/0284830 | A1 | 9/2016 | Shimizu | |
| 2017/0133499 | A1* | 5/2017 | Mizue | H01L 29/66462 |

FOREIGN PATENT DOCUMENTS

| | | |
|---|---|---|
| JP | 2013-207274 | 10/2013 |
| JP | 2016-181631 | 10/2016 |

\* cited by examiner

SEMICONDUCTOR DEVICE, POWER SUPPLY CIRCUIT, COMPUTER, AND METHOD OF MANUFACTURING SEMICONDUCTOR DEVICE

CROSS-REFERENCE TO RELATED APPLICATION

This patent is based upon and claims the priority from Japanese Patent Application No. 2017-005807, filed on Jan. 17, 2017, the entire contents of which are incorporated herein by reference.

FIELD

Embodiments described herein relate generally to a semiconductor device, a power supply circuit, a computer, and a method of manufacturing a semiconductor device.

BACKGROUND

For circuits such as switching power supply circuits and inverter circuits, semiconductor devices such as switching devices and diodes are used. Such semiconductor devices are required to have high breakdown voltage and low on-resistance. There is a trade-off relationship determined by device materials between the breakdown voltage and the on-resistance.

With the advancement in development of technology, low on-resistance for semiconductor devices has been realized down to the limit of silicon which is a major device material. In order to further improve the breakdown voltage and further reduce the on-resistance, it is necessary to change the device materials. By using GaN-based semiconductors such as GaN and AlGaN as switching device materials, it is possible to improve the trade-off relationship determined by the materials and to achieve rapidly-progressive high breakdown voltage and low on-resistance.

However, for example, in a switching device using a GaN-based semiconductor, there is a problem of "current collapse" in which on-resistance increases when a high drain voltage is applied.

DETAILED DESCRIPTION

Figure 1:
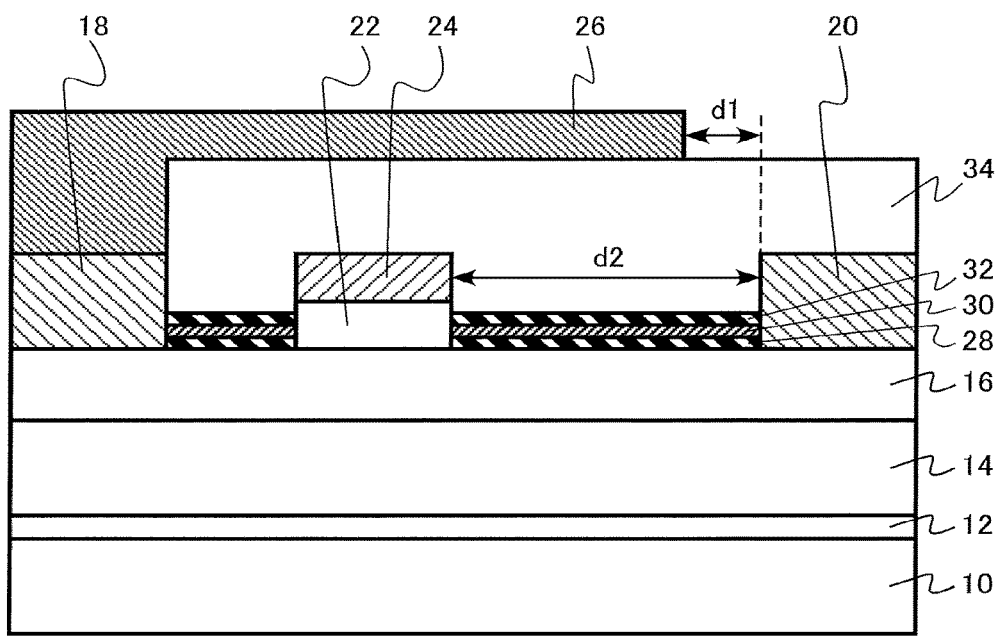
FIG. 1 is a schematic cross-sectional diagram of a semiconductor device according to a first embodiment.

A semiconductor device according to an embodiment is configured to include: a first nitride semiconductor layer containing gallium (Ga); a second nitride semiconductor layer provided on the first nitride semiconductor layer, the second nitride semiconductor layer having a band gap larger than that of the first nitride semiconductor layer, and the second nitride semiconductor layer containing gallium (Ga); a first electrode provided on or above the first nitride semiconductor layer, and the first electrode electrically connected to the first nitride semiconductor layer; a second electrode provided on or above the first nitride semiconductor layer, and the second electrode electrically connected to the first nitride semiconductor layer; a gate electrode provided between the first electrode and the second electrode, and the gate electrode provided on or above the first nitride semiconductor layer; a conductive layer provided on or above the second nitride semiconductor layer, and the conductive layer electrically connected to the first electrode or the gate electrode, a first distance between the conductive layer and the second electrode being smaller than a second distance between the gate electrode and the second electrode; a first aluminum oxide layer provided between the second nitride semiconductor layer and the conductive layer, and provided between the gate electrode and the second electrode; a silicon oxide layer provided between the first aluminum oxide layer and the conductive layer; and a second aluminum oxide layer provided between the silicon oxide layer and the conductive layer.

In this specification, the same or similar members are denoted by the same reference numerals, and the redundant description may be omitted.

In this specification, "GaN-based semiconductor" is a generic name of gallium nitride (GaN), aluminum nitride (AlN), indium nitride (InN), and semiconductors having intermediate compositions thereof.

In this specification, "undoped" means that an impurity concentration is $1\times10^{15}$ cm$^{-3}$ or less.

In this specification, in order to illustrate a positional relationship of components and the like, the upward direction of a drawing is described as "above", and the downward direction of a drawing is described as "below". In this specification, the concepts "above" and "below" are not necessarily terms indicating the relationship with the direction of gravity.

First Embodiment

A semiconductor device according to an embodiment is configured to include: a first nitride semiconductor layer containing gallium (Ga); a second nitride semiconductor layer provided on the first nitride semiconductor layer, having a band gap larger than that of the first nitride semiconductor layer, and containing gallium (Ga); a first electrode provided on the first nitride semiconductor layer and electrically connected to the first nitride semiconductor layer; a second electrode provided on the first nitride semiconductor layer and electrically connected to the first nitride semiconductor layer; a gate electrode provided on the first nitride semiconductor layer and provided between the first electrode and the second electrode; a conductive layer which is provided on the second nitride semiconductor layer and of which a first distance to the second electrode is smaller than a second distance between the second electrode and the gate electrode; a first aluminum oxide layer which is at least partially provided between the gate electrode and the second electrode and which is provided between the second nitride semiconductor layer and the conductive layer; a silicon oxide layer which is at least partially provided between the first aluminum oxide layer and the conductive layer; and a second aluminum oxide layer which is at least partially provided between the silicon oxide layer and the conductive layer.

FIG. 1 is a schematic cross-sectional diagram of a semiconductor device according to the embodiment. The semiconductor device according to the embodiment is an HEMT (High Electron Mobility Transistor) using a GaN-based semiconductor.

As illustrated in FIG. 1, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), a drain electrode 20 (second electrode), a p-type layer 22, a gate electrode 24, a source field plate 26 (conductive layer), a first aluminum oxide layer 28, a silicon oxide layer 30, a second aluminum oxide layer 32, and a protective film 34.

The substrate 10 is made of, for example, silicon (Si). Besides the silicon, for example sapphire ($Al_2O_3$) or silicon carbide (SiC) may be applied.

On the substrate 10, a buffer layer 12 is provided. The buffer layer 12 has a function of alleviating the lattice mismatch between the substrate 10 and the channel layer 14. The buffer layer 12 is formed with, for example, a multilayer structure of aluminum gallium nitride ($Al_WGa_{1-W}N$ (0<W<1)).

By increasing the thickness of the buffer layer 12, it is possible to improve not only the breakdown voltage in longitudinal direction but also the breakdown voltage in the transverse direction. For example, it is considered that a stacked structure of AlN (0.2 µm)/$Al_{0.7}Ga_{0.3}N$ (0.5 µm)/$Al_{0.5}N$ (0.5 µm)/$Al_{0.3}Ga_{0.7}N$ (1.0 µm)/$Al_{0.1}Ga_{0.9}N$ (1.0 µm) may be used for the buffer layer 12. The buffer layer 12 is configured so that the band gap is as large as possible while distortion is alleviated.

The channel layer 14 is provided on the buffer layer 12. The channel layer 14 is also referred to as an electron transit layer. The channel layer 14 contains gallium (Ga). The channel layer 14 is made of, for example, undoped (0≤X<1). More specifically, the channel layer is made of, for example, undoped GaN. The thickness of the channel layer 14 is, for example, 0.1 µm or more and 10 µm or less.

For example, it is considered that a stacked structure having a characteristic distribution of carbon concentration is used for the channel layer 14. For example, there is a structure in which a thin film with a high carbon concentration is provided on the substrate 10 side and a thin film with a low carbon concentration is provided on the thin film. Specifically, GaN (0.6 µm: carbon concentration of $1\times10^{18}$ cm$^{-1}$ or more and $5\times10^{19}$ cm$^{-3}$ or less, typically $1\times10^{19}$ cm$^{-3}$)/GaN (0.6 µm: carbon concentration of $1\times10^{16}$ cm$^{-3}$ or more and $5\times10^{17}$ cm$^{-3}$ or less, typically $4\times10^{16}$ cm$^{-3}$)/GaN (0.5 µm: carbon concentration of $1\times10^{15}$ cm$^{-3}$ or more and $5\times10^{16}$ cm$^{-3}$ or less, typically $5\times10^{15}$ cm$^{-3}$) and the like are exemplified. In this structure, charge trap using carbon is successfully used, so that leakage characteristics are improved. Furthermore, a junction of an n-type and a p-type is formed between the layer having a low carbon concentration and the layer having a high carbon concentration, so that the leak characteristics are improved.

The barrier layer 16 is provided on the channel layer 14. The barrier layer 16 is also referred to as an electron supply layer. The band gap of the barrier layer 16 is larger than the band gap of the channel layer 14. The barrier layer 16 contains gallium (Ga). The barrier layer 16 is made of, for example, undoped $Al_YGa_{1-Y}N$ (0<Y≤1, X<Y). More specifically, the barrier layer is made of, for example, undoped $Al_{0.25}Ga_{0.75}N$. The thickness of the barrier layer 16 is, for example, 10 nm or more and 100 nm or less.

A heterojunction interface is formed between the channel layer 14 and the barrier layer 16 is. A two-dimensional electron gas (2DEG) is formed at the heterojunction interface and becomes a carrier in the HEMT.

The source electrode 18 is provided on the channel layer 14 and the barrier layer 16. The source electrode 18 is electrically connected to the channel layer 14 and the barrier layer 16.

The source electrode 18 is, for example, a metal electrode. The source electrode 18 is, for example, a stacked structure of titanium (Ti) and aluminum (Al). It is preferable that an ohmic contact is formed between the source electrode 18 and the barrier layer 16.

The drain electrode 20 is provided on the channel layer and the barrier layer 16. The drain electrode 20 is electrically connected to the channel layer 14 and the barrier layer 16.

The drain electrode 20 is, for example, a metal electrode. The drain electrode 20 has, for example, a stacked structure of titanium (Ti) and aluminum (Al). It is preferable that an ohmic contact is formed between the drain electrode 20 and the barrier layer 16.

The distance between the source electrode 18 and the drain electrode 20 is, for example, 5 μm or more and 30 μm or less.

The p-type layer 22 is provided on the channel layer 14 and the barrier layer 16. The p-type layer 22 is in contact with the barrier layer 16. The p-type layer 22 is provided between the source electrode 18 and the drain electrode 20. The p-type layer 22 is made of, for example, single crystal p-type GaN.

The p-type layer 22 has a function of increasing the threshold voltage of the HEMT.

The gate electrode 24 is provided on the channel layer 14 and the barrier layer 16. The gate electrode 24 is provided between the source electrode 18 and the drain electrode 20. The gate electrode 24 is provided on the p-type layer 22. The gate electrode 24 is in contact with the p-type layer 22.

The gate electrode 24 is, for example, a metal electrode. The gate electrode 24 is made of, for example, titanium nitride (TiN).

A source field plate 26 is provided on the barrier layer 16. A first distance ("d1" in FIG. 1) in the horizontal direction between the drain electrode 20 and the source field plate 26 is shorter than a second distance ("d2" in FIG. 1) in the horizontal direction between the drain electrode 20 and the gate electrode 24. In other words, the end portion of the drain electrode 20 side of the source field plate 26 is located between the gate electrode 24 and the drain electrode 20.

The source field plate 26 is physically and electrically connected to the source electrode 18. The source field plate 26 has a function of alleviating an electric field of the time when a high drain voltage is applied and suppressing the current collapse.

The source field plate 26 is, for example, a metal electrode. The source field plate 26 is made of, for example, titanium nitride (TiN).

The first aluminum oxide layer 28 is provided between the gate electrode 24 and the drain electrode 20. The first aluminum oxide layer 28 is provided between the source electrode 18 and the gate electrode 24. The first aluminum oxide layer 28 is provided between the barrier layer 16 and the source field plate 26. The first aluminum oxide layer 28 is provided on the barrier layer 16 to be in contact with the barrier layer 16.

The first aluminum oxide layer 28 contains an aluminum oxide as a main component. The first aluminum oxide layer 28 may contain components other than the aluminum oxide. The first aluminum oxide layer 28 is, for example, amorphous. The thickness of the first aluminum oxide layer 28 is, for example, 1 nm or more and 10 nm or less.

The silicon oxide layer 30 is provided between the gate electrode 24 and the drain electrode 20. The silicon oxide layer 30 is provided between the source electrode 18 and the gate electrode 24. The silicon oxide layer 30 is provided between the first aluminum oxide layer 28 and the source field plate 26. The silicon oxide layer 30 is provided on the first aluminum oxide layer 28 to be in contact with the first aluminum oxide layer 28.

The silicon oxide layer 30 contains a silicon oxide as a main component. The silicon oxide layer 30 may contain components other than the silicon oxide. The silicon oxide layer 30 is, for example, amorphous. The thickness of the silicon oxide layer 30 is, for example, 10 nm or more and 30 nm or less.

The second aluminum oxide layer 32 is provided between the gate electrode 24 and the drain electrode 20. The second aluminum oxide layer 32 is provided between the source electrode 18 and the gate electrode 24. The second aluminum oxide layer 32 is provided between the silicon oxide layer 30 and the source field plate 26. The second aluminum oxide layer 32 is provided on the silicon oxide layer 30 to be in contact with the silicon oxide layer 30.

The second aluminum oxide layer 32 contains an aluminum oxide as a main component. The second aluminum oxide layer 32 may contain components other than the aluminum oxide. The second aluminum oxide layer 32 is, for example, amorphous. The thickness of the second aluminum oxide layer 32 is, for example, 1 nm or more and 10 nm or less.

The protective film 34 is provided between the gate electrode 24 and the source field plate 26 and between the second aluminum oxide layer 32 and the source field plate 26. The protective film 34 is an insulating film. The protective film 34 is made of, for example, a silicon oxide, a silicon oxynitride, or a silicon nitride.

The types and concentrations of elements in each layer can be measured by, for example, secondary ion mass spectrometry (SIMS).

Next, an example of a method of manufacturing a semiconductor device according to the embodiment will be described. FIGS. 2 to 7 are schematic cross-sectional diagrams of the semiconductor device during manufacturing according to the embodiment.

In the method of manufacturing a semiconductor device according to the embodiment, a first aluminum oxide layer is formed on a nitride semiconductor layer containing gallium (Ga), a silicon oxide layer is formed on the first aluminum oxide layer, a second aluminum oxide layer is formed on the silicon oxide layer, and a conductive layer is formed on the second aluminum oxide layer.

First, a substrate 10, for example, a silicon substrate is prepared. Next, a multilayer structure of aluminum gallium nitride to be a buffer layer 12 is formed on the silicon substrate by, for example, epitaxial growth. For example, the buffer layer 12 is grown by a metal organic chemical vapor deposition (MOCVD) method.

Next, undoped GaN serving as a channel layer 14 and undoped $Al_{0.25}Ga_{0.75}N$ serving as a barrier layer 16 are formed on the buffer layer 12 by epitaxial growth. For example, the channel layer 14 and the barrier layer 16 are grown by the MOCVD method.

Figure 2:
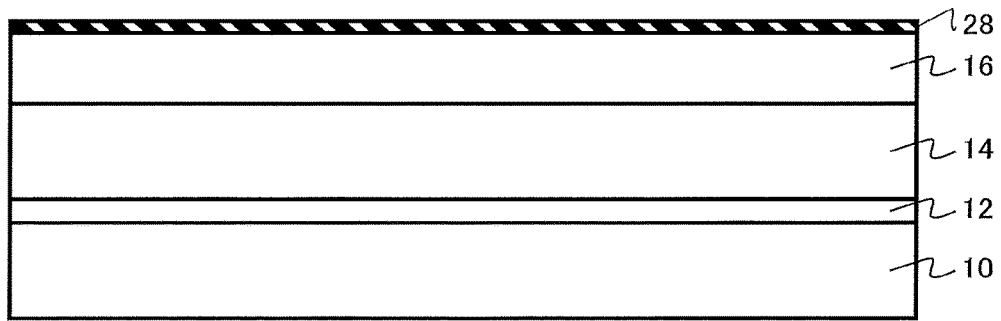
FIG. 2 is a schematic cross-sectional diagram of the semiconductor device during manufacturing according to the first embodiment.

Next, a first aluminum oxide layer 28 is formed on the barrier layer 16 (FIG. 2). The first aluminum oxide layer 28 is formed by, for example, an atomic layer deposition (ALD) method. The thickness of the first aluminum oxide layer 28 is, for example, 2 nm.

Figure 3:
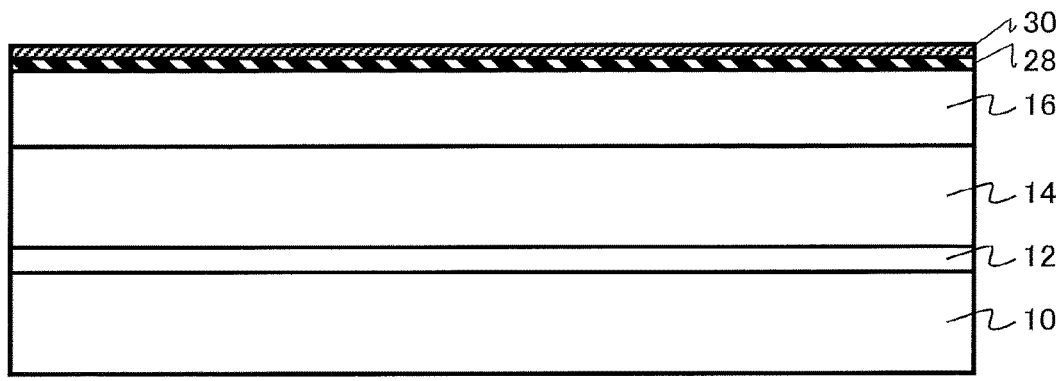
FIG. 3 is a schematic cross-sectional diagram of the semiconductor device during manufacturing according to the first embodiment.

Next, a silicon oxide layer 30 is formed on the first aluminum oxide layer 28 (FIG. 3). The silicon oxide layer 30 is formed by, for example, the ALD method. The thickness of the silicon oxide layer 30 is, for example, 15 nm.

Figure 4:
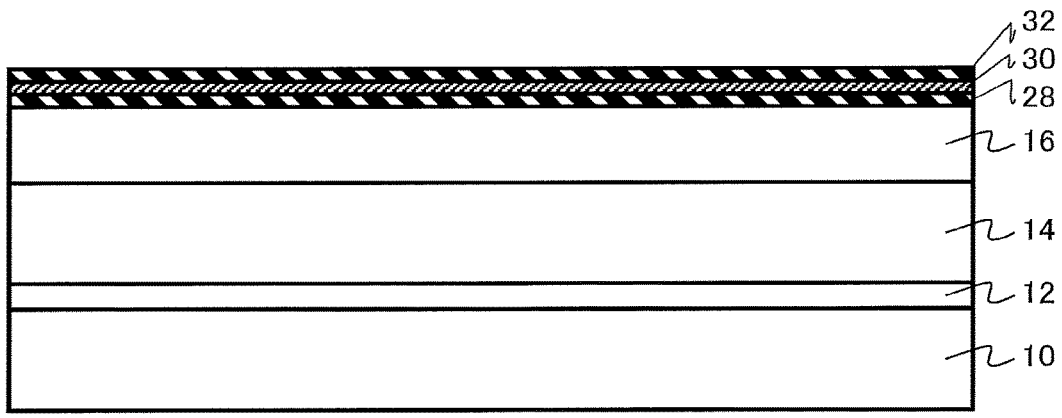
FIG. 4 is a schematic cross-sectional diagram of the semiconductor device during manufacturing according to the first embodiment.

Next, a second aluminum oxide layer 32 is formed on the silicon oxide layer 30 (FIG. 4). The second aluminum oxide layer 32 is formed by, for example, the ALD method. The thickness of the second aluminum oxide layer 32 is, for example, 2 nm.

After that, heat treatment is performed under a non-oxidizing atmosphere. For example, heat treatment is performed under a nitrogen atmosphere. The temperature of the heat treatment is, for example, 700° C. or more and 1100° C. or less. The densification of the first aluminum oxide layer 28, the silicon oxide layer 30, and the second aluminum oxide layer 32 is performed by heat treatment.

Figure 5:
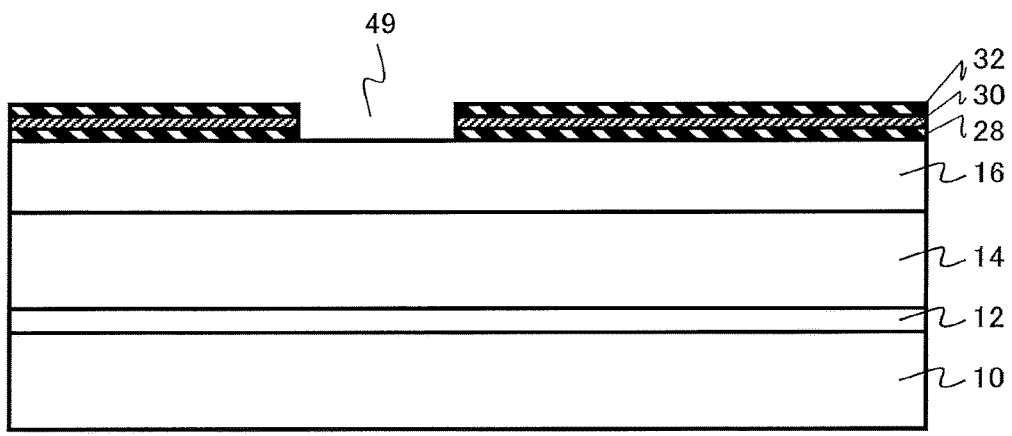
FIG. 5 is a schematic cross-sectional diagram of the semiconductor device during manufacturing according to the first embodiment.

Next, an opening 49 is formed in predetermined regions of the first aluminum oxide layer 28, the silicon oxide layer 30, and the second aluminum oxide layer 32 to expose the barrier layer 16 (FIG. 5). The opening 49 is formed by, for example, a lithography method and a reactive ion etching method.

Figure 6:
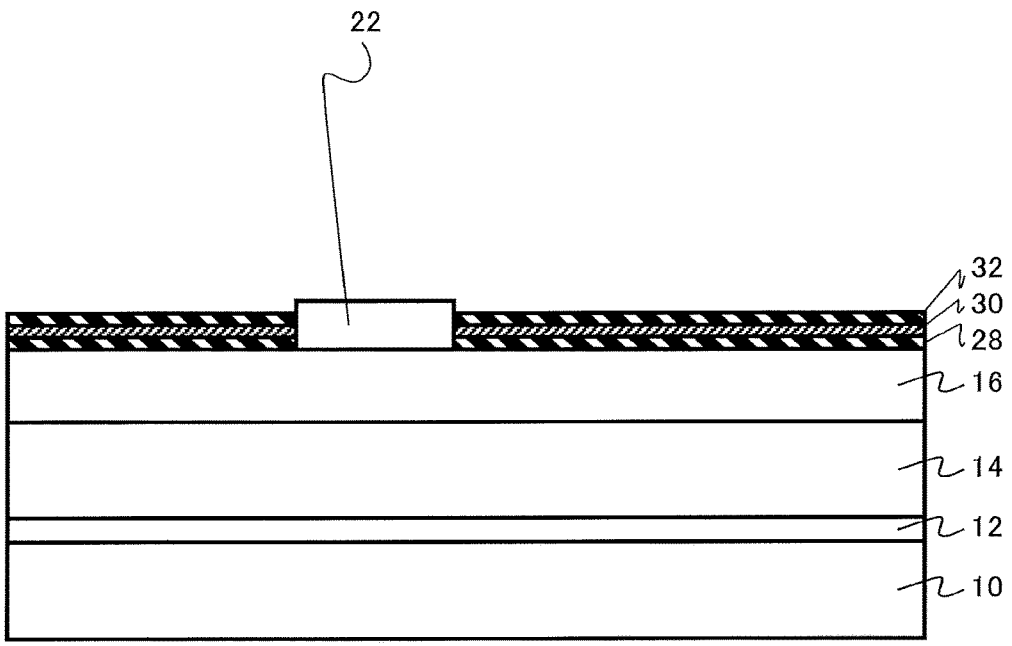
FIG. 6 is a schematic cross-sectional diagram of the semiconductor device during manufacturing according to the first embodiment.

Next, a p-type layer 22 is formed in the opening 49 (FIG. 6). For example, p-type GaN to be the p-type layer 22 is formed by selective epitaxial growth. For example, the p-type layer 22 is grown by an MOCVD method.

Figure 7:
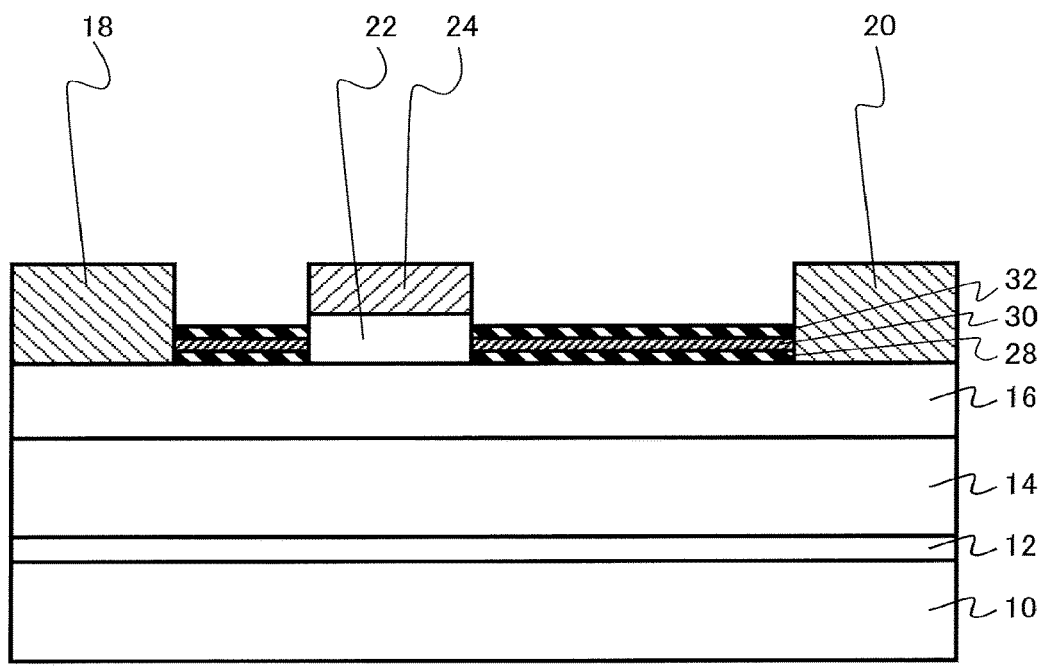
FIG. 7 is a schematic cross-sectional diagram of the semiconductor device during manufacturing according to the first embodiment.

Next, the source electrode 18, the drain electrode 20, and the gate electrode 24 are formed by a known method (FIG. 7). After that, the protective film 34 and the source field plate 26 are formed by a known method.

By the above manufacturing method, the HEMT illustrated in FIG. 1 is manufactured.

Next, the function and effect of the semiconductor device according to the embodiment will be described.

In the HEMT according to the embodiment, the silicon oxide layer 30 interposed between the first aluminum oxide layer 28 and the second aluminum oxide layer 32 is provided between the barrier layer 16 containing Ga and the source field plate 26. According to the above configuration, it is possible to suppress the current collapse in which the on-resistance increases when a high drain voltage is applied. Hereinafter, details thereof will be described.

A silicon oxide has a function as a high barrier against electrons among insulators, and thus, the silicon oxide is suitable for applications to an insulating layer of a semiconductor device. The silicon oxide is also useful as an insulating layer for an HEMT of a GaN-based semiconductor.

However, in the cases where a silicon oxide layer is formed immediately above a GaN-based semiconductor containing Ga, gallium from the GaN-based semiconductor diffuses into the silicon oxide layer. The Gallium in the silicon oxide layer forms a trap level, which can cause the current collapse. In addition, the gallium in the silicon oxide layer becomes movable ions and causes a change in threshold voltage. Therefore, the reliability of the HEMT is deteriorated.

In the HEMT according to the embodiment, the first aluminum oxide layer 28 provided between the barrier layer 16 containing gallium and the silicon oxide layer 30 functions as a barrier against diffusion of gallium. Therefore, the amount of gallium in the silicon oxide layer 30 can be reduced. Therefore, it is possible to suppress the current collapse of the HEMT. In addition, the reliability of the HEMT is improved.

However, even if the amount of gallium in the silicon oxide layer 30 can be reduced, for example, electrons are trapped in the interface state existing at the interface between the barrier layer 16 and the first aluminum oxide layer 28 and the resulting current collapse may not be suppressed sufficiently. When a high drain voltage is applied, electrons directed to the barrier layer 16 from the source field plate 26 and the gate electrode 24 are trapped in the interface state, which is a problem. For this reason, it is preferable that the barrier against electrons injected from the source field plate 26 and the gate electrode 24 is heightened.

Figure 8:
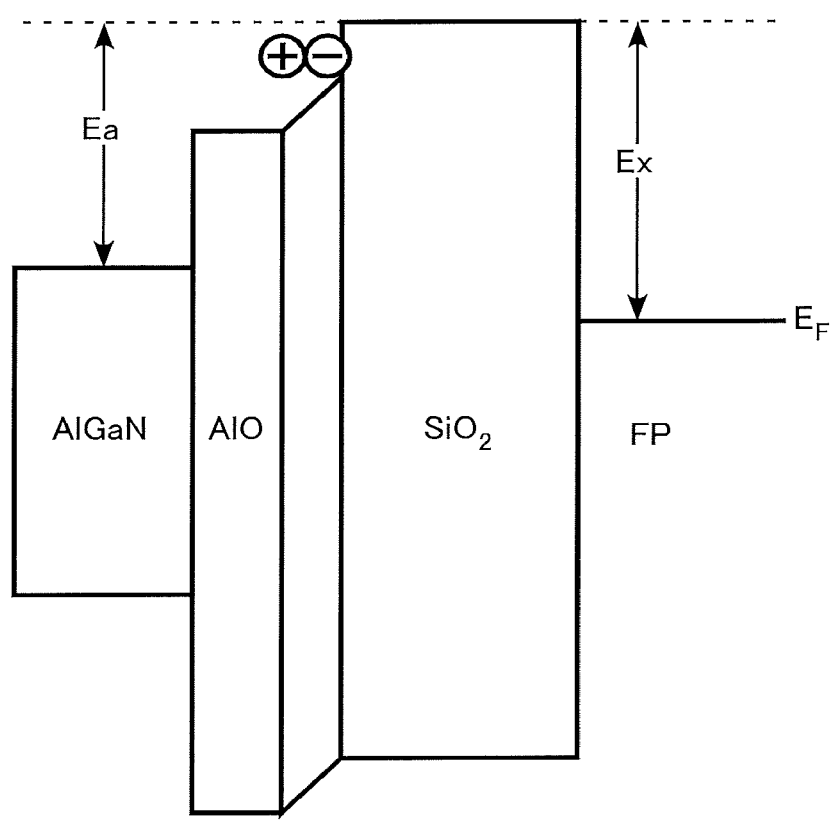
FIG. 8 is an explanatory diagram of the function and effect of the semiconductor device according to the first embodiment.

FIG. 8 is an explanatory diagram of the function and effect of the semiconductor device according to the embodiment. The figure illustrates an energy band diagram when the second aluminum oxide layer 32 does not exist. Namely, the figure illustrates an energy band diagram of the barrier layer 16 (corresponding to "AlGaN" in FIG. 8), the first aluminum oxide layer 28 (corresponding to "AlO" in FIG. 8), the silicon oxide layer 30 (corresponding to "SiO$_2$" in FIG. 8), and the source field plate 26 (corresponding to "FP" in FIG. 8). In FIG. 8, the protective film 34 is omitted. In addition, it is assumed that the source field plate 26 is made of a metal.

When the stacked structure of the first aluminum oxide layer 28 and the silicon oxide layer 30 is formed, a certain amount of aluminum from the first aluminum oxide layer 28 diffuses into the silicon oxide layer 30. In addition, a certain amount of silicon from the silicon oxide layer 30 diffuses into the first aluminum oxide layer 28. Aluminum in the silicon oxide layer 30 and silicon in the first aluminum oxide layer 28 interact with each other to form a fixed dipole. As illustrated in FIG. 8, in the fixed dipole to be formed, the first aluminum oxide layer 28 side is positive, and the silicon oxide layer 30 side is negative.

The fixed dipole is formed between the first aluminum oxide layer 28 and the silicon oxide layer 30, so that the energy difference ("Ea" in FIG. 8) between the lower end of the conduction band of the silicon oxide layer 30 and the lower end of the conduction band of the barrier layer 16 is larger than that in a case where there is no fixed dipole. For this reason, the barrier against the electrons directed from the barrier layer 16 toward the source field plate 26 is heightened. On the other hand, the barrier against the electrons directed from the source field plate 26 toward the barrier layer 16 depends on the energy difference ("Ex" in FIG. 8) between the lower end of the conduction band of the silicon oxide layer 30 and the Fermi level ("$E_F$" in FIG. 8) of the source field plate 26.

Figure 9:
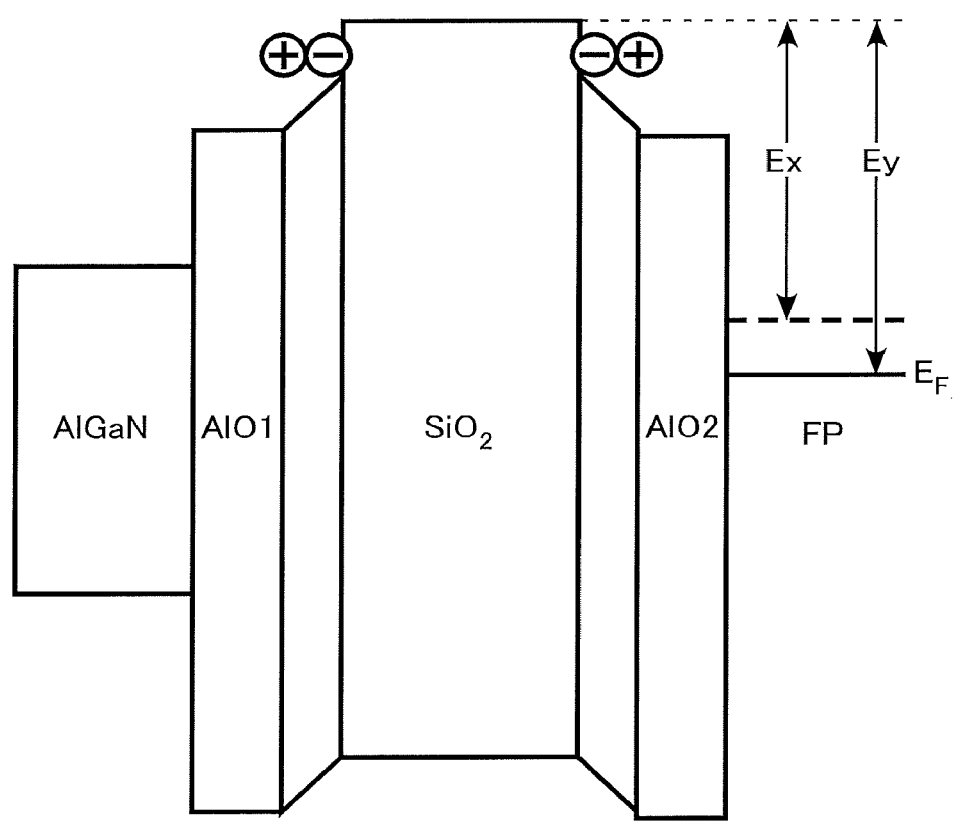
FIG. 9 is an explanatory diagram of the function and effect of the semiconductor device according to the first embodiment.

FIG. 9 is an explanatory diagram of the function and effect of the semiconductor device according to the embodiment. The figure illustrates an energy band diagram in the case of the HEMT according to the embodiment in which the second aluminum oxide layer 32 exists. Namely, the figure illustrates an energy band diagram of the barrier layer 16 (corresponding to "AlGaN" in FIG. 9), the first aluminum oxide layer 28 (corresponding to "AlO1" in FIG. 9), the silicon oxide layer 30 (corresponding to "SiO$_2$" in FIG. 9), the second aluminum oxide layer 32 (corresponding to "AlO2" in FIG. 9), and the source field plate 26 (corresponding to "FP" in FIG. 9). In FIG. 9, the protective film 34 is omitted. In addition, it is assumed that the source field plate 26 is made of a metal.

In the case of the HEMT according to the embodiment, when a stacked structure of the silicon oxide layer 30 and the second aluminum oxide layer 32 is formed, a certain amount of aluminum from the second aluminum oxide layer 32 diffuses into the silicon oxide layer 30. In addition, a certain amount of silicon from the silicon oxide layer 30 diffuses into the second aluminum oxide layer 32. Aluminum in the silicon oxide layer 30 and silicon in the second aluminum oxide layer 32 interact with each other to form a fixed dipole. As illustrated in FIG. 9, in the fixed dipole to be formed, the second aluminum oxide layer 32 side is positive, and the silicon oxide layer 30 side is negative.

Hereinafter, in order to simplify the description, the fixed dipole formed between the first aluminum oxide layer 28 and the silicon oxide layer 30 is referred to as a first fixed dipole, and the fixed dipole formed between the silicon oxide layer 30 and the second aluminum oxide layer 32 is referred to as a second fixed dipole.

In the HEMT according to the embodiment, the second fixed dipole is formed between the silicon oxide layer 30 and the second aluminum oxide layer 32, so that the energy difference ("Ey" in FIG. 9) between the lower end of the conduction band of the silicon oxide layer 30 and the Fermi level ("$E_F$" in FIG. 9) of the source field plate 26 is larger than that ("Ex" in FIG. 9) in a case where there is no second fixed dipole. For this reason, the barrier against the electrons directed from the source field plate 26 toward the barrier layer 16 is heightened. Therefore, it is possible to suppress the current collapse of the HEMT as compared with the case where there is no second fixed dipole.

In addition, the barrier against electrons between the barrier layer 16 and the source field plate 26 is heightened in both directions. Therefore, the leakage current between the barrier layer 16 and the source field plate 26 is also suppressed.

In addition, since the barrier against the electrons directed from the gate electrode 24 toward the barrier layer 16 through the silicon oxide layer 30 is also heightened, it is possible to suppress the current collapse caused by the electron injection from the gate electrode 24.

Figure 10:
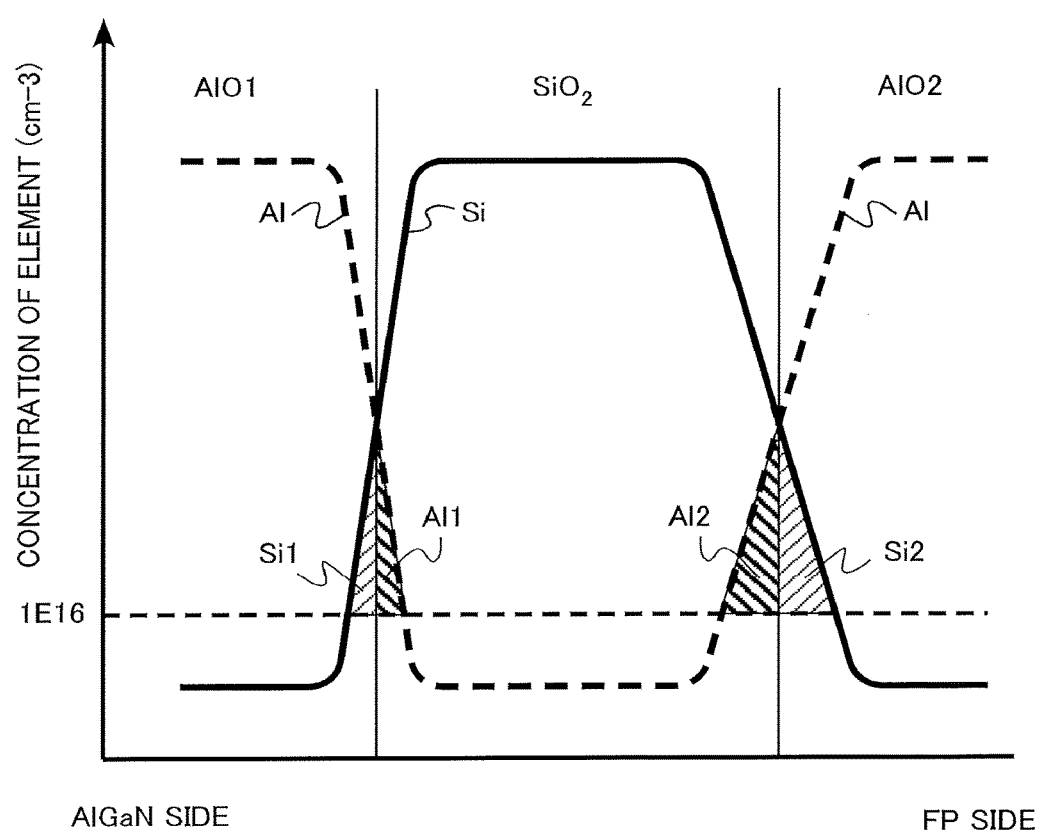
FIG. 10 is an explanatory diagram of the function and effect of the semiconductor device according to the first embodiment.

FIG. 10 is an explanatory diagram of the function and effect of the semiconductor device according to the embodiment. The figure is a schematic diagram illustrating the distribution of silicon and aluminum in the first aluminum oxide layer 28 (corresponding to "AlO1" in FIG. 10), the silicon oxide layer 30 (corresponding to "$SiO_2$" in FIG. 10), and the second aluminum oxide layer 32 (corresponding to "AlO2" in FIG. 10). The solid line illustrates the concentration distribution of silicon, and the dotted line illustrates the concentration distribution of aluminum.

As described above, a certain amount of aluminum from the first aluminum oxide layer 28 and the second aluminum oxide layer 32 diffuses into the silicon oxide layer 30. In addition, a certain amount of silicon from the silicon oxide layer 30 diffuses into the first aluminum oxide layer 28 and the second aluminum oxide layer 32. In addition, the boundary between the first aluminum oxide layer 28 and the silicon oxide layer 30 and the boundary between the silicon oxide layer 30 and the second aluminum oxide layer 32 are defined as the position where the concentration distribution of silicon and the concentration distribution of aluminum intersect each other.

As illustrated in FIG. 10, it is preferable that the amount of aluminum ("Al2" in FIG. 10) on the second aluminum oxide layer 32 side of the silicon oxide layer 30 is larger than the amount of aluminum ("Al1" in FIG. 10) on the first aluminum oxide layer 28 side of the silicon oxide layer 30. In addition, it is preferable that the amount of silicon ("Si2" in FIG. 10) in the second aluminum oxide layer 32 is larger than the amount of silicon ("Si1" in FIG. 10) in the first aluminum oxide layer 28.

With the above configuration, the size of the second fixed dipole becomes larger than the size of the first fixed dipole. Therefore, the barrier against the electrons directed from the source field plate 26 and the gate electrode 24 toward the barrier layer 16 is further heightened. Therefore, it is possible to further suppress the current collapse.

By adjusting the thickness at the time of forming the first aluminum oxide layer 28, the silicon oxide layer 30, the second aluminum oxide layer 32 and by adjusting the heat treatment process, it is possible to form the concentration distribution of silicon and aluminum as illustrated in FIG. 10.

For example, it is preferable that the thickness of the second aluminum oxide layer 32 is larger than the thickness of the first aluminum oxide layer 28. By increasing the thickness of the second aluminum oxide layer 32, it is possible to allow the amount of aluminum ("Al2" in FIG. 10) on the second aluminum oxide layer 32 side of the silicon oxide layer 30 to be larger than the amount of aluminum ("Al1" in FIG. 10) on the first aluminum oxide layer 28 side of the silicon oxide layer 30. Therefore, the size of the second fixed dipole can be allowed to be larger than the size of the first fixed dipole. Therefore, it is possible to further suppress the current collapse.

As illustrated in FIG. 10, it is preferable that a region having a concentration of aluminum of $1 \times 10^{16}$ cm$^{-3}$ or less exists in the silicon oxide layer 30. If the concentration of aluminum in the silicon oxide layer 30 is too high, aluminum may form a trap level, and the reliability of the HEMT may be deteriorated.

As described above, with the HEMT according to the embodiment, it is possible to suppress the current collapse.

Second Embodiment

A semiconductor device according to the embodiment is different from that of the first embodiment in that a first aluminum oxide layer contains at least one first element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and a second aluminum oxide layer contains at least one second element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N). Hereinafter, description of redundant contents of the first embodiment will be omitted.

Figure 11:
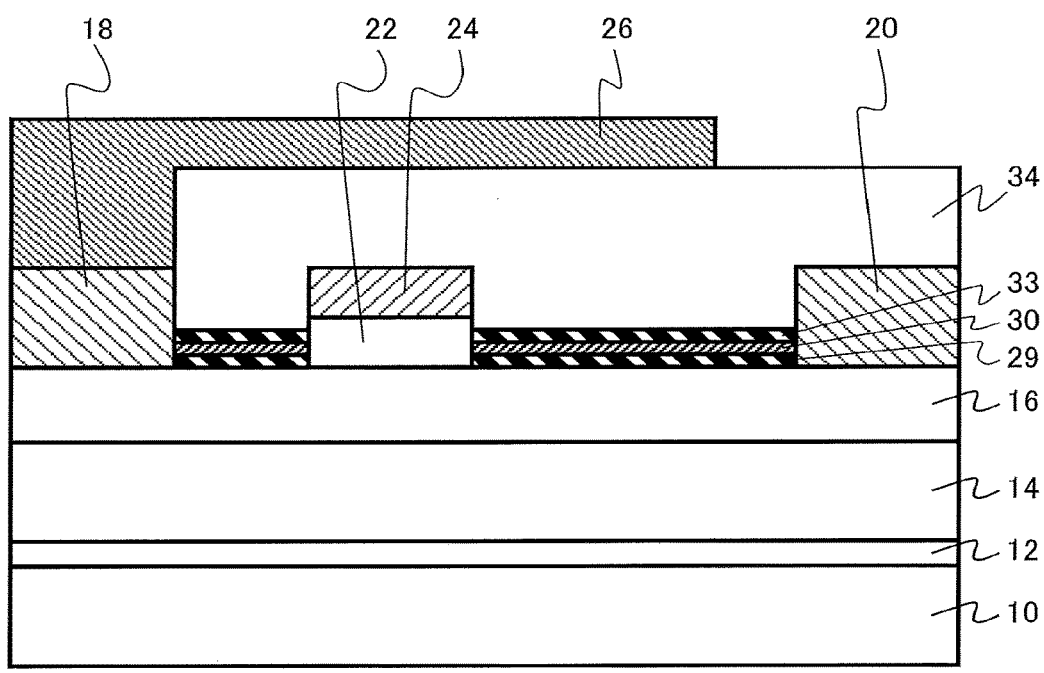
FIG. 11 is a schematic cross-sectional diagram of a semiconductor device according to a second embodiment.

FIG. 11 is a schematic cross-sectional diagram of the semiconductor device according to the embodiment. The semiconductor device according to the embodiment is an HEMT using a GaN-based semiconductor.

As illustrated in FIG. 11, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), a drain electrode 20 (second electrode), a p-type layer 22, a gate electrode 24, a source field plate 26 (conductive layer), a first aluminum oxide layer 29, a silicon oxide layer 30, a second aluminum oxide layer 33, and a protective film 34.

The first aluminum oxide layer 29 is provided between the gate electrode 24 and the drain electrode 20. The first aluminum oxide layer 29 is provided between the source electrode 18 and the gate electrode 24. The first aluminum oxide layer 29 is provided between the barrier layer 16 and the source field plate 26. The first aluminum oxide layer 29 is provided on the barrier layer 16 to be in contact with the barrier layer 16.

The first aluminum oxide layer 29 contains an aluminum oxide as a main component. The first aluminum oxide layer 29 contains at least one first element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N). The concentration of the first element in the first aluminum oxide layer 29 is, for example, 10% or more and 30% or less of the concentration of aluminum.

The first aluminum oxide layer 29 is, for example, amorphous. The thickness of the first aluminum oxide layer 29 is, for example, 1 nm or more and 10 nm or less.

The silicon oxide layer 30 is provided between the gate electrode 24 and the drain electrode 20. The silicon oxide layer 30 is provided between the source electrode 18 and the gate electrode 24. The silicon oxide layer 30 is provided between the first aluminum oxide layer 28 and the source field plate 26. The silicon oxide layer 30 is provided on the first aluminum oxide layer 29 to be in contact with the first aluminum oxide layer 29.

The silicon oxide layer 30 contains a silicon oxide as a main component. The silicon oxide layer 30 may contain components other than the silicon oxide. The silicon oxide layer 30 is, for example, amorphous. The thickness of the silicon oxide layer 30 is, for example, 10 nm or more and 30 nm or less.

The second aluminum oxide layer 33 is provided between the gate electrode 24 and the drain electrode 20. The second aluminum oxide layer 33 is provided between the source electrode 18 and the gate electrode 24. The second aluminum oxide layer 33 is provided between the silicon oxide layer 30 and the source field plate 26. The second aluminum oxide layer 33 is provided on the silicon oxide layer 30 to be in contact with the silicon oxide layer 30.

The second aluminum oxide layer 33 contains an aluminum oxide as a main component. The second aluminum oxide layer 33 contains at least one second element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N). The concentration of the second element in the second aluminum oxide layer 33 is, for example, 30% or less than 10% of the concentration of aluminum. The second element contained in the second aluminum oxide layer 33 may be the same as or different from the first element contained in the first aluminum oxide layer 29.

The second aluminum oxide layer 33 is, for example, amorphous. The thickness of the second aluminum oxide layer 32 is, for example, 1 nm or more and 10 nm or less.

The types and concentrations of elements in each layer can be measured by, for example, SIMS.

Next, an example of the method of manufacturing a semiconductor device according to the embodiment will be described. FIGS. 12 to 16 are schematic cross-sectional diagrams of the semiconductor device during manufacturing according to the embodiment. Hereinafter, the case where both the first element and the second element are nitrogen will be described as an example.

First, a substrate 10, for example, a silicon substrate is prepared. Next, for example, a buffer layer 12 is grown epitaxially on the silicon substrate.

Next, a channel layer 14 and a barrier layer 16 are grown on the buffer layer 12.

Figure 12:
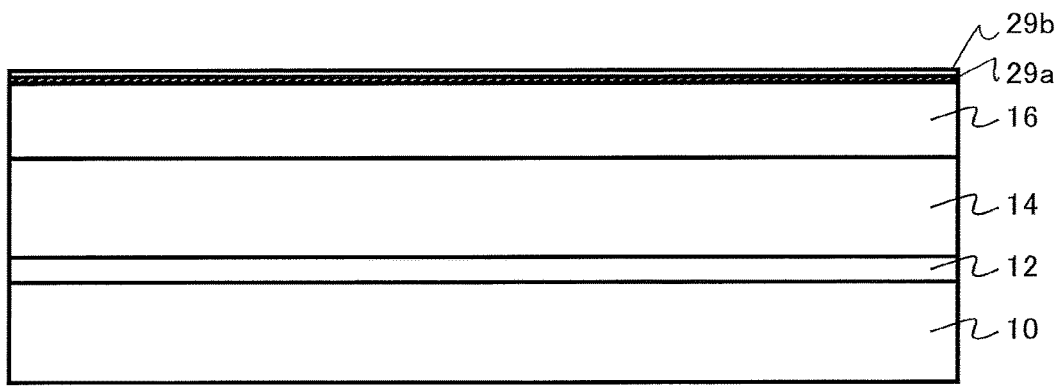
FIG. 12 is a schematic cross-sectional diagram of the semiconductor device during manufacturing according to the second embodiment.

Next, an aluminum nitride film 29a and an aluminum oxide film 29b are formed on the barrier layer 16 (FIG. 12). The aluminum nitride film 29a and the aluminum oxide film 29b are formed by, for example, the ALD method. The thickness of the aluminum nitride film 29a is, for example, 1 nm. The thickness of the aluminum oxide film 29b is, for example, 1 nm.

Figure 13:
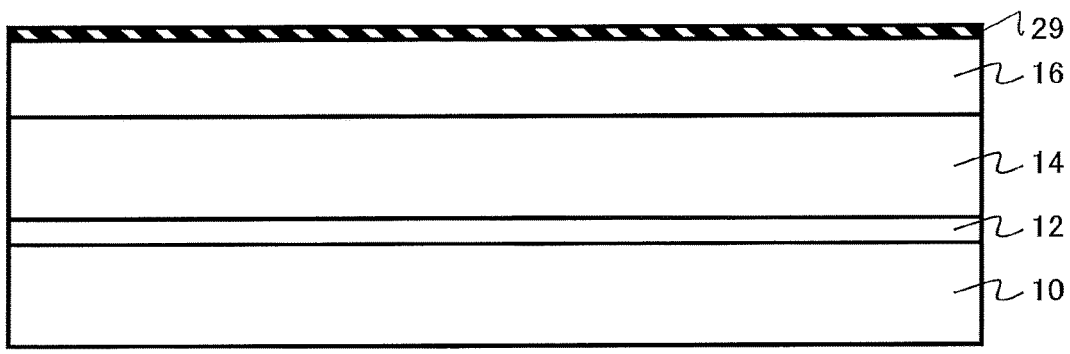
FIG. 13 is a schematic cross-sectional diagram of the semiconductor device during manufacturing according to the second embodiment.

Next, first heat treatment is performed under a non-oxidizing atmosphere. For example, the first heat treatment is performed under a nitrogen atmosphere. The temperature of the first heat treatment is, for example, 700° C. or more and 1100° C. or less. By the first heat treatment, the first aluminum oxide layer 29 containing nitrogen is formed (FIG. 13). In addition, the densification of the first aluminum oxide layer 29 is performed by the first heat treatment.

Figure 14:
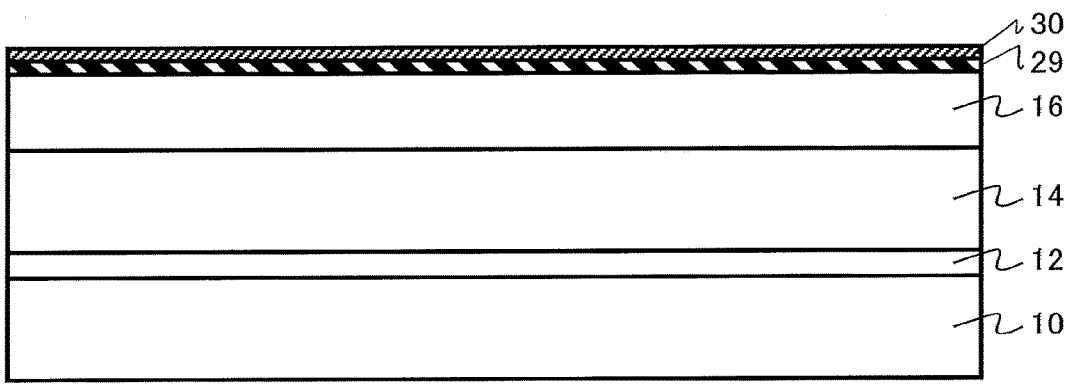
FIG. 14 is a schematic cross-sectional diagram of the semiconductor device during manufacturing according to the second embodiment.

Next, a silicon oxide layer 30 is formed on the first aluminum oxide layer 29 (FIG. 14). The silicon oxide layer 30 is formed by, for example, the ALD method. The thickness of the silicon oxide layer 30 is, for example, 15 nm.

Figure 15:
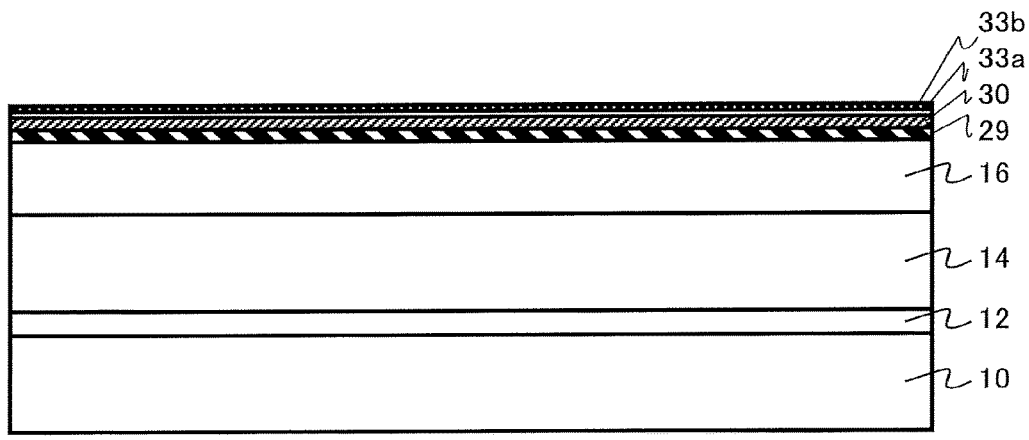
FIG. 15 is a schematic cross-sectional diagram of the semiconductor device during manufacturing according to the second embodiment.

Next, an aluminum nitride film 33a and an aluminum oxide film 33b are formed on the silicon oxide layer 30 (FIG. 15). The aluminum nitride film 33a and the aluminum oxide film 33b are formed by, for example, the ALD method. The thickness of the aluminum nitride film 33a is, for example, 1 nm. The thickness of the aluminum oxide film 33b is, for example, 1 nm.

Figure 16:
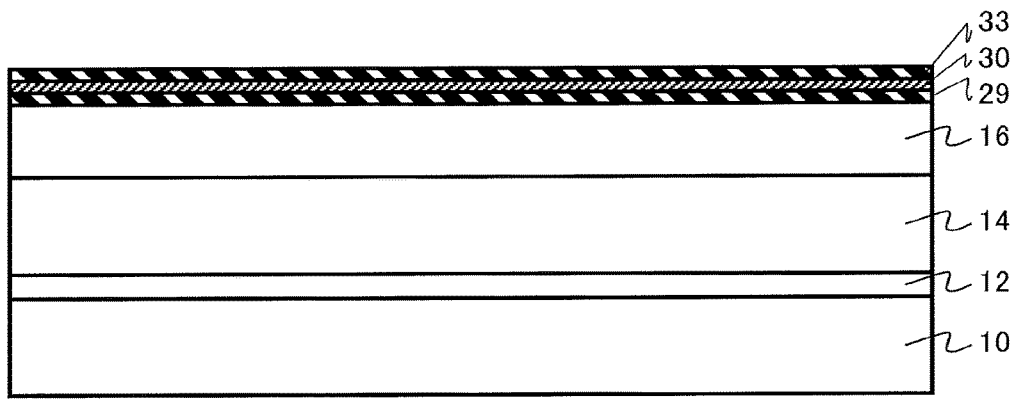
FIG. 16 is a schematic cross-sectional diagram of the semiconductor device during manufacturing according to the second embodiment.

Next, second heat treatment is performed under a non-oxidizing atmosphere. The temperature of the second heat treatment is, for example, 700° C. or more and 1100° C. or less. By the second heat treatment, the second aluminum oxide layer 33 containing nitrogen is formed (FIG. 16). In addition, the densification of the silicon oxide layer 30 and the second aluminum oxide layer 33 is performed by the second heat treatment.

After that, the p-type layer 22, the source electrode 18, the drain electrode 20, the gate electrode 24, the protective film 34, and the source field plate 26 are formed by the same method as the manufacturing method according to the first embodiment.

By the above manufacturing method, the HEMT illustrated in FIG. 11 is manufactured.

Next, the function and effect of the semiconductor device according to the embodiment will be described.

If the first aluminum oxide layer 29 is crystallized by heat treatment, charges tend to be trapped, and the current collapse tends to occur. For example, the crystallization of aluminum oxide is facilitated by the heat treatment at 800° C. or more. A similar problem also occurs in a case where the second aluminum oxide layer 33 is crystallized.

In the HEMT according to the embodiment, the first elements as impurities are added to the first aluminum oxide layer 29, so that it is possible to suppress the crystallization of the first aluminum oxide layer 29. In addition, the second elements as impurities are added to the second aluminum oxide layer 33, so that it is possible to suppress the crystallization of the second aluminum oxide layer 33. Therefore, it is possible to further suppress the current collapse as compared with the first embodiment.

It is considered that the oxygen deficiencies in an aluminum oxide facilitate the crystallization of the aluminum oxide. It is considered that the occurrence of oxygen deficiencies is suppressed by adding impurities into the aluminum oxide, or the crystallization of the aluminum oxide is suppressed by suppressing the diffusion of oxygen deficiencies.

From the viewpoint of suppressing the crystallization, it is preferable that the concentration of the first element in the first aluminum oxide layer 29 is 10% or more of the concentration of aluminum. Since the concentration of the first element in the first aluminum oxide layer 29 is more effective in a case where the concentration is 15% or more of the concentration of aluminum, and thus, it is preferable that the concentration is 15% or more. If the concentration exceeds 30% of the concentration of aluminum, ΔEc and ΔEv are greatly affected. Thus, it is preferable that the concentration does not to exceed 30%. From the viewpoint of not lowering ΔEc and ΔEv, it is preferable that the concentration is 25% or less of the concentration of aluminum, and it is more preferable that the concentration is 20% or less. In addition, ΔEc is the energy difference between the lower end of the conduction band of the barrier layer 16 and the lower end of the conduction band of the first aluminum oxide layer 29, and ΔEv is the energy difference between the upper end of the valence band of the barrier layer 16 and the upper end of the valence band of the first aluminum oxide layer 29.

In addition, from the viewpoint of suppressing the crystallization, it is preferable that the concentration of the second element in the second aluminum oxide layer 33 is 10% or more of the concentration of aluminum. Since the concentration of the second element in the second aluminum oxide layer 33 is more effective in a case where the concentration is 15% or more of the concentration of aluminum, and thus, it is preferable that the concentration is 15% or more. If the concentration exceeds 30% of the concentration of aluminum, ΔEc and ΔEv are greatly affected. Thus, it is preferable that the concentration does not exceed 30%. From the viewpoint of not lowering ΔEc and ΔEv, it is preferable that the concentration is 25% or less of the concentration of aluminum, and it is more preferable that the concentration is 20% or less. In addition, ΔEc is the energy difference between the lower end of the conduction band of the barrier layer 16 and the lower end of the conduction band of the second aluminum oxide layer 33, and ΔEv is the energy difference between the upper end of the valence band of the barrier layer 16 and the upper end of the valence band of the second aluminum oxide layer 33.

Figure 17:
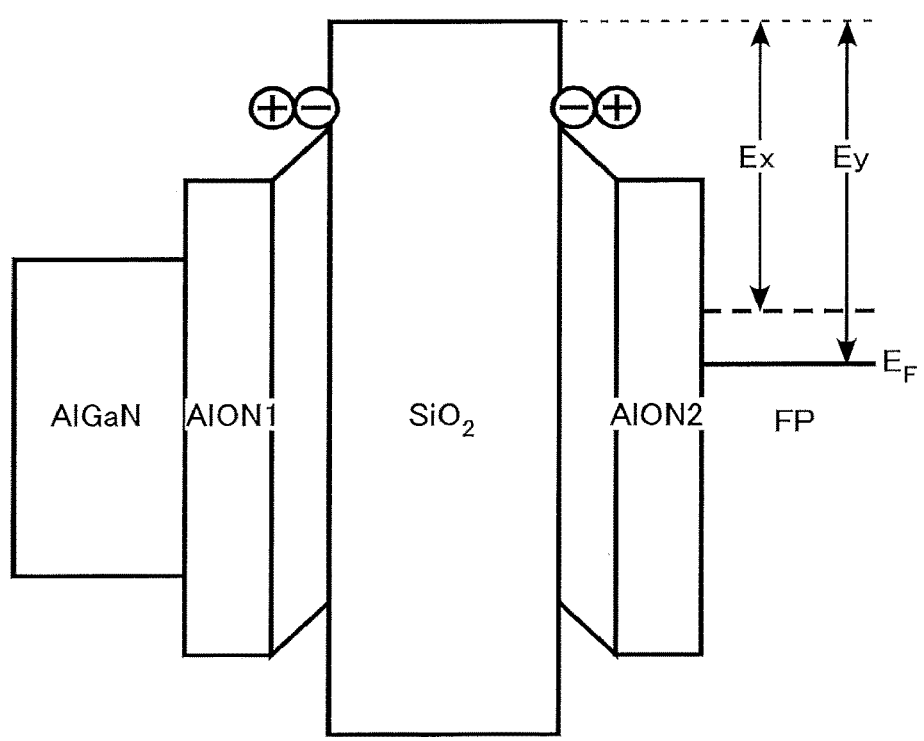
FIG. 17 is an explanatory diagram of the function and effect of the semiconductor device according to the second embodiment.

FIG. 17 is an explanatory diagram of the function and effect of the semiconductor device according to the embodiment. The figure illustrates an energy band diagram of the HEMT according to the embodiment. Namely, the figure illustrates an energy band diagram of the barrier layer 16 (corresponding to "AlGaN" in FIG. 17), the first aluminum oxide layer 29 (corresponding to "AlON1" in FIG. 17), the silicon oxide layer 30 (corresponding to "SiO$_2$" in FIG. 17), the second aluminum oxide layer 33 (corresponding to "AlON2" in FIG. 17), and the source field plate 26 (corresponding to "FP" in FIG. 17). In FIG. 17, the protective film 34 is omitted. In addition, it is assumed that the source field plate 26 is made of a metal.

Hereinafter, in order to simplify the description, the fixed dipole formed between the first aluminum oxide layer 29 and the silicon oxide layer 30 is referred to as a first fixed dipole, and the fixed dipole formed between the silicon oxide layer 30 and the second aluminum oxide layer 33 is referred to as a second fixed dipole.

Similar to the HEMT of the first embodiment, the second fixed dipole is formed, so that the energy difference ("Ey" in FIG. 17) between the lower end of the conduction band of the silicon oxide layer 30 and the Fermi level ("E$_F$" in FIG. 17) of the source field plate 26 is larger than that ("Ex" in FIG. 17) in a case where there is no second fixed dipole. Therefore, the barrier against the electrons directed from the source field plate 26 toward the barrier layer 16 is heightened. Therefore, it is possible to suppress the current collapse of the HEMT as compared with the case where there is no second fixed dipole.

In addition, the barrier against electrons between the barrier layer 16 and the source field plate 26 is heightened in both directions. Therefore, the leakage current between the barrier layer 16 and the source field plate 26 is also suppressed.

In addition, since the barrier against the electrons directed from the gate electrode 24 toward the barrier layer 16 through the silicon oxide layer 30 is also heightened, it is also possible to suppress the current collapse caused by the electron injection from the gate electrode 24.

Similarly to the first embodiment, from the viewpoint of further suppressing the current collapse, it is preferable that the amount of aluminum on the second aluminum oxide layer 33 side of the silicon oxide layer 30 is larger than the amount of aluminum on the first aluminum oxide layer 29 in the silicon oxide layer 30. In addition, it is preferable that the amount of silicon in the second aluminum oxide layer 33 is larger than the amount of silicon in the first aluminum oxide layer 29.

In addition, similarly to the first embodiment, from the viewpoint of further suppressing the current collapse, it is preferable that the thickness of the second aluminum oxide layer 33 is larger than the thickness of the first aluminum oxide layer 29.

A divalent element and a pentavalent element facilitate the diffusion of aluminum in an aluminum oxide. Therefore, from the viewpoint of increasing the size of the second fixed dipole, it is preferable that magnesium (Mg), calcium (Ca), strontium (Sr), or barium (Ba) which is a divalent element or nitrogen (N) which is a pentavalent element is used for the second element. It is considered that the pentavalent element and the divalent element form the oxygen deficiencies in an aluminum oxide, so that the bond between oxygen and aluminum which is a trivalent element is weakened to facilitate the diffusion of aluminum.

From the viewpoint of facilitating the production of the HEMT, it is preferable that the same element is used for the first element and the second element. In a case where the same divalent element or pentavalent element is used for the first element and the second element, from the viewpoint of setting the size of the second fixed dipole to be larger than the size of the first fixed dipole, it is preferable that the concentration of the second element in the second aluminum oxide layer 33 is higher than the concentration of the first element in the first aluminum oxide layer 29.

For example, in a case where the first element and the second element are nitrogen, it is preferable that the concentration of nitrogen in the second aluminum oxide layer 33 is higher than the concentration of nitrogen in the first aluminum oxide layer 29. Due to the high concentration of nitrogen in the second aluminum oxide layer 33, the diffusion of aluminum is facilitated, and the amount of aluminum on the second aluminum oxide layer 33 side of the silicon oxide layer 30 is larger than the amount of aluminum on the first aluminum oxide layer 29 side of the silicon oxide layer

30. Therefore, the size of the second fixed dipole becomes larger than the size of the first fixed dipole.

From the viewpoint of suppressing the diffusion of aluminum and reducing the size of the first fixed dipole on the first aluminum oxide layer 29 side, it is preferable that boron (B), gallium (Ga), scandium (Sc), yttrium (Y), or a lanthanoid (La, Ce, Pr, Nd, Pm, Sm, Eu, Gd, Tb, Dy, Ho, Er, Tm, Yb, or Lu) which is a trivalent element is used for the first element. It is considered that the trivalent element suppresses the diffusion of aluminum since the trivalent element does not form oxygen deficiencies in an aluminum oxide.

On the other hand, the trivalent element itself together with silicon forms a fixed dipole. Therefore, in order to adjust the size of the fixed dipole, it is necessary to optimize the amount of trivalent element and the temperature and time of heat treatment.

It is preferable that the concentration of the first element in the silicon oxide layer 30 is lower than the concentration of the first element in the first aluminum oxide layer 29 and the concentration of the second element in the silicon oxide layer 30 is lower than the concentration of the at least one second element in the second aluminum oxide layer 33. This is because the first element or the second element in the silicon oxide layer 30 may forms a trap level, so that characteristic variation of the HEMT may occur.

In the manufacturing method according to the embodiment, the first heat treatment for the formation and densification of the first aluminum oxide layer 29 is performed before the formation of the silicon oxide layer 30 and the second aluminum oxide layer 33. Therefore, the diffusion of aluminum from the first aluminum oxide layer 29 into the silicon oxide layer 30 is suppressed. In addition, the diffusion of silicon from the silicon oxide layer 30 into the first aluminum oxide layer 29 is also suppressed.

On the other hand, since the second heat treatment is performed in a state where the silicon oxide layer 30 and the second aluminum oxide layer 33 are stacked, the diffusion of aluminum from the second aluminum oxide layer 33 into the silicon oxide layer 30 is facilitated. In addition, the diffusion of silicon from the silicon oxide layer 30 into the second aluminum oxide layer 33 is also facilitated.

Therefore, the size of the second fixed dipole can be configured to be larger than the size of the first fixed dipole.

It is preferable that the first aluminum oxide layer 29 contains at least one first element selected from a group consisting of magnesium (Mg), calcium (Ca), strontium (Sr), barium (Ba), and nitrogen (N), and at the same time, the first aluminum oxide layer 29 contains at least one third element selected from a group consisting of fluorine (F), hydrogen (H), and deuterium (D). Furthermore, it is preferable that the concentration of the first element at an arbitrary position (first position) in the first aluminum oxide layer 29 is 80% or more and 120% or less of the concentration of the third element at the first position.

In addition, it is preferable that the second aluminum oxide layer 33 contains at least one second element selected from a group consisting of magnesium (Mg), calcium (Ca), strontium (Sr), barium (Ba), and nitrogen (N), and at the same time, the second aluminum oxide layer 33 contains at least one fourth element selected from a group consisting of fluorine (F), hydrogen (H), and deuterium (D). In addition, it is preferable that the concentration of the second element at an arbitrary position (second position) in the second aluminum oxide layer 33 is 80% or more and 120% or less of the concentration of the fourth element at the arbitrary position (second position).

In a case where a divalent metal such as magnesium (Mg), calcium (Ca), strontium (Sr), or barium (Ba) or nitrogen (N) is introduced into the aluminum oxide layer, if at least one of fluorine (F), Hydrogen (H), and deuterium (D) is introduced into the film simultaneously or later, an insulating film with an improved band gap and improved insulating characteristics can be obtained. In particular, the AlONF film, BaAlOF film, and the like using fluorine (F) have a larger band gap than the aluminum oxide layer containing no fluorine. This is because the electronegativity of fluorine is larger than that of oxygen and, thus, a stronger bond is formed.

In a case where a divalent metal such as magnesium (Mg), calcium (Ca), strontium (Sr), or barium (Ba) or nitrogen (N) is added to the aluminum oxide layer, oxygen deficiencies are formed, so that the state where the oxygen deficiencies do not diffuse is established. It is considered that the existence of oxygen deficiencies causes $\Delta Ec$ and $\Delta Ev$ to decrease. Therefore, the insulating characteristics of the insulating film tend to be deteriorated.

Herein, if at least one of fluorine, hydrogen, and deuterium is introduced, the oxygen deficiencies can be allowed to be buried, so that the sum of the amount of nitrogen+ the amount of metal number II and the sum of the amount of fluorine+ the amount of hydrogen+ the amount of deuterium are substantially equal to each other. For example, the AlON film can be subjected to a long-term low temperature plasma fluorination treatment and a long-term low temperature plasma hydrogen (or deuterium) treatment. The thickness of the AlON film is preferably 10 nm or less, more preferably 5 nm or less. This is because the distance that fluorine or hydrogen (or deuterium) can reach in an active state during the plasma treatment is limited, and if the thickness is about 5 nm, oxygen deficiencies can be efficiently buried.

The oxygen deficiencies are buried with fluorine, hydrogen, and deuterium, so that $\Delta Ec$ and $\Delta Ev$ are improved. Since almost of the oxygen deficiencies are removed, the crystallization does not occur up to a higher temperature. Therefore, the film is converted into a more dense film as a result of high-temperature annealing, so that it is possible to forma film having excellent insulating characteristics. In particular, in the case of using F, $\Delta Ec$ and $\Delta Ev$ is improved as compared with the aluminum oxide layer which does not contain fluorine, so that the insulating film has particularly excellent insulating characteristics.

As described above, with the HEMT according to the embodiment, it is possible to further suppress the current collapse as compared with the first embodiment.

Third Embodiment

A semiconductor device according to the embodiment is the same as that of the first embodiment except that a first aluminum oxide layer, a silicon oxide layer, and a second aluminum oxide layer are provided between the first nitride semiconductor layer and the gate electrode. Hereinafter, description of redundant contents of the first embodiment will be omitted.

Figure 18:
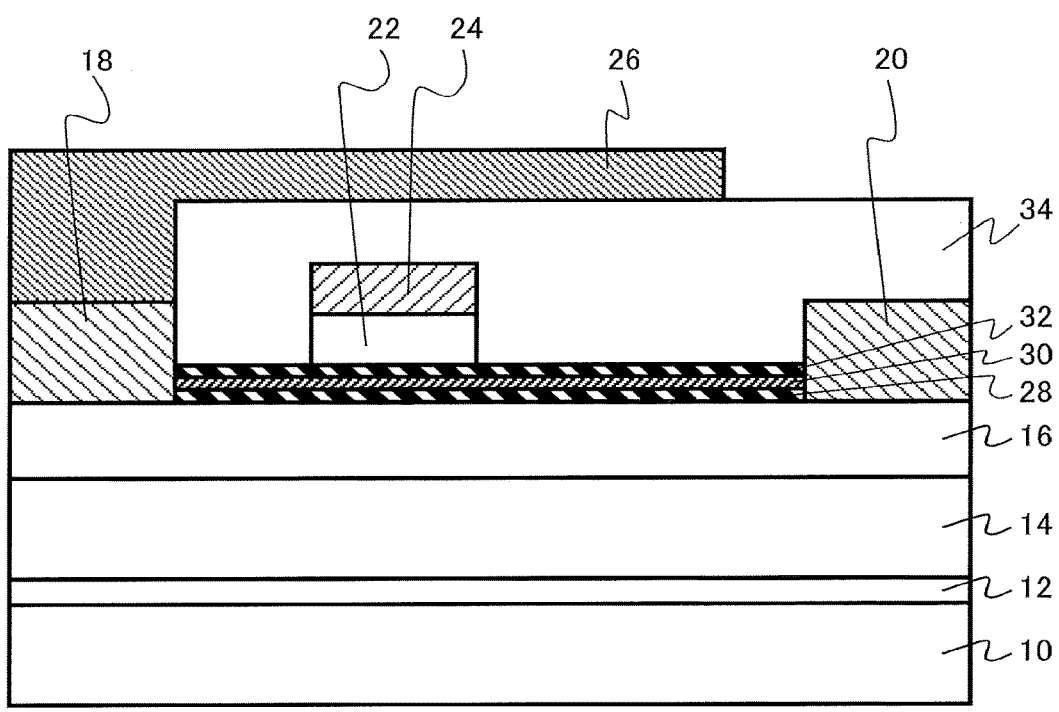
FIG. 18 is a schematic cross-sectional diagram of a semiconductor device according to a third embodiment.

FIG. 18 is a schematic cross-sectional diagram of the semiconductor device according to the embodiment. The semiconductor device according to the embodiment is an HEMT using a GaN-based semiconductor.

As illustrated in FIG. 18, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), a drain electrode 20 (second electrode), a p-type layer 22, a gate electrode 24, a source field plate 26 (conductive layer), a first aluminum oxide layer 28, a silicon oxide layer 30, a second aluminum oxide layer 32, and a protective film 34.

The first aluminum oxide layer 28, the silicon oxide layer 30, and the second aluminum oxide layer 32 are provided between the barrier layer 16 and the gate electrode 24. The first aluminum oxide layer 28, the silicon oxide layer 30, and the second aluminum oxide layer 32 are provided between the barrier layer 16 and the p-type layer 22.

The p-type layer 22 has a function of increasing the threshold voltage of the HEMT. The p-type layer 22 is, for example, polycrystalline p-type GaN.

Next, the function and effect of the semiconductor device according to the embodiment will be described.

Similarly to the first embodiment, the HEMT according to the third embodiment can suppress the current collapse in which the on-resistance increases when a high drain voltage is applied. Furthermore, it is possible to suppress a decrease in threshold voltage of the HEMT caused by providing the first aluminum oxide layer 28 serving as a barrier against diffusion of gallium. Furthermore, it is possible to invert and increase the threshold voltage. Hereinafter, details thereof will be described.

Figure 19:
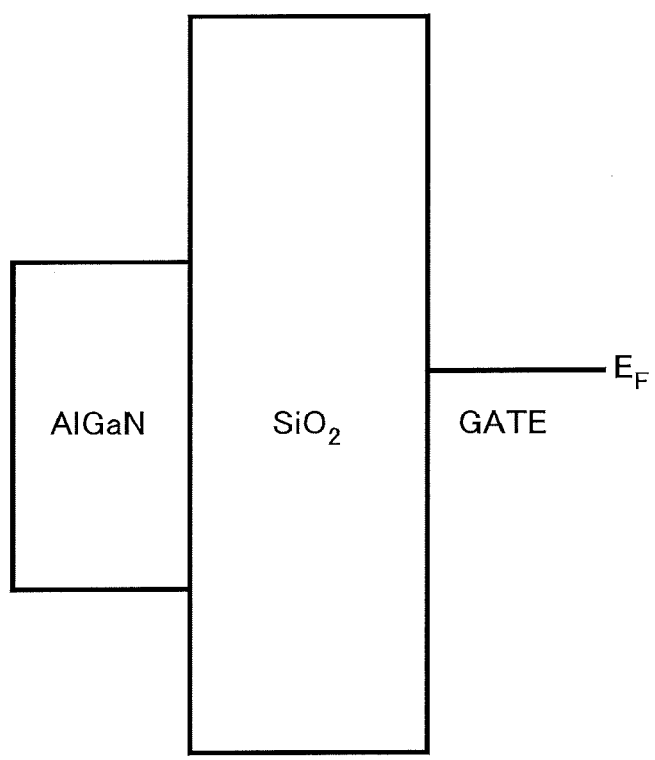
FIG. 19 is an explanatory diagram of the function and effect of the semiconductor device according to the third embodiment.

FIG. 19 is an explanatory diagram of the function and effect of the semiconductor device according to the embodiment. FIG. 19 illustrates an energy band diagram in a case where the first aluminum oxide layer 28 and the second aluminum oxide layer 32 are absent. Namely, the figure illustrates an energy band diagram of the barrier layer 16 (corresponding to "AlGaN" in FIG. 19), the silicon oxide layer 30 (corresponding to "SiO$_2$" in FIG. 19), and the gate electrode 24 (corresponding to "GATE" in FIG. 19). In FIG. 19, the p-type layer 22 is omitted. In addition, it is assumed that the gate electrode 24 is made of a metal.

Figure 20:
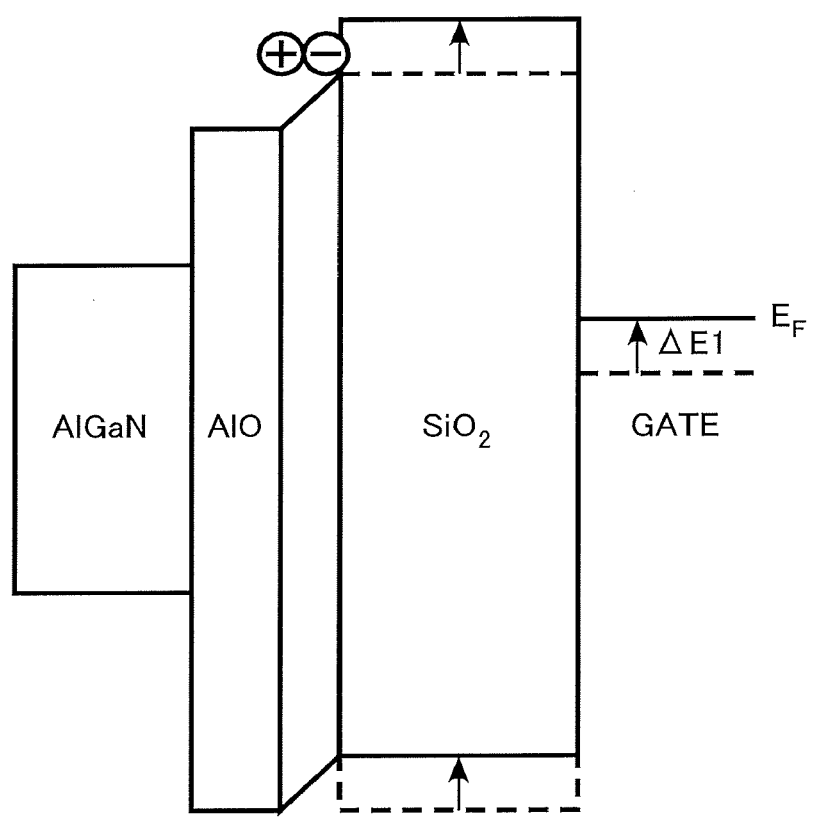
FIG. 20 is an explanatory view of the function and effect of the semiconductor device according to the third embodiment.

FIG. 20 is an explanatory diagram of the function and effect of the semiconductor device according to the embodiment. FIG. 20 illustrates an energy band diagram in a case where the first aluminum oxide layer 28 is provided. Namely, the figure illustrates an energy band diagram of the barrier layer 16 (corresponding to "AlGaN" in FIG. 20), the first aluminum oxide layer 28 (corresponding to "AlO" in FIG. 20), the silicon oxide layer 30 (corresponding to "SiO$_2$" in FIG. 20), and the gate electrode 24 (corresponding to "GATE" in FIG. 20). In FIG. 20, the p-type layer 22 is omitted. In addition, it is assumed that the gate electrode 24 is made of a metal.

Similarly to the case of the first embodiment, the first aluminum oxide layer 28 is provided, so that a first fixed dipole is formed on the barrier layer 16 side of the silicon oxide layer 30. For this reason, the Fermi level ("$E_F$" in FIGS. 19 and 20) of the gate electrode 24 is shifted by $\Delta E1$ as compared with the case where the first aluminum oxide layer 28 does not exist, and the effective work function of the gate electrode 24 decreases. Therefore, the threshold voltage of the HEMT decreases as compared with the case where the first aluminum oxide layer 28 does not exist. In addition, $\Delta E1$ depends on the size of the first fixed dipole.

Figure 21:
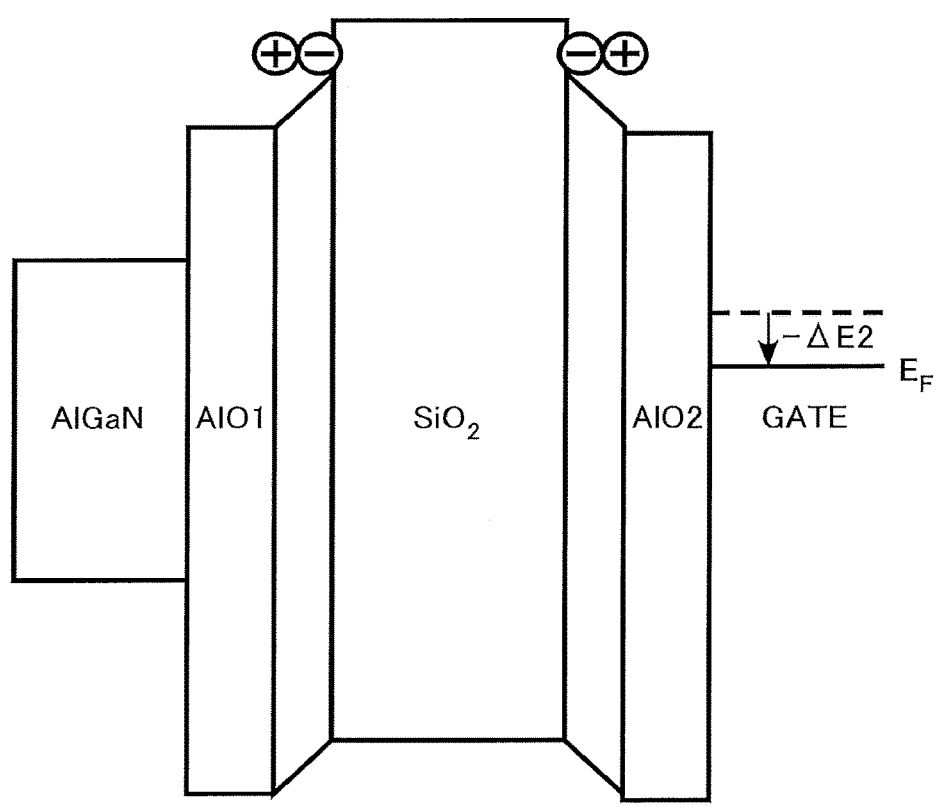
FIG. 21 is an explanatory diagram of the function and effect of the semiconductor device according to the third embodiment.

FIG. 21 is an explanatory diagram of the function and effect of the semiconductor device according to the embodiment. FIG. 21 illustrates an energy band diagram in the case of the HEMT according to the embodiment in which the second aluminum oxide layer 32 exists. Namely, the figure illustrates an energy band diagram of the barrier layer 16 (corresponding to "AlGaN" in FIG. 21), the first aluminum oxide layer 28 (corresponding to "AlO1" in FIG. 21), the silicon oxide layer 30 (corresponding to "SiO$_2$" in FIG. 21), the second aluminum oxide layer 32 (corresponding to "AlO2" in FIG. 21), and the gate electrode 24 (corresponding to "GATE" in FIG. 21). In FIG. 21, the p-type layer 22 is omitted. In addition, it is assumed that the gate electrode 24 is made of a metal.

Similarly to the case of the first embodiment, the second aluminum oxide layer 32 is provided, so that a second fixed dipole of which the positive and negative directions are opposite to those of the first fixed dipole on the barrier layer 16 side is formed on the gate electrode 24 side of the silicon oxide layer 30. For this reason, the Fermi level ("$E_F$" in FIG. 21) of the gate electrode 24 is shifted by $-\Delta E2$ as compared with the case where the second aluminum oxide layer 32 does not exist, and the effective work function of the gate electrode 24 increases. Therefore, the threshold voltage of the HEMT increases as compared with the case where the second aluminum oxide layer 32 does not exist. Therefore, it is possible to suppress a decrease in threshold voltage of the HEMT caused by providing the first aluminum oxide layer 28, and furthermore, it is possible to invert and increase the threshold voltage. In addition, $\Delta E2$ depends on the size of the second fixed dipole.

It is preferable that the amount of aluminum of the second aluminum oxide layer 32 side of the silicon oxide layer 30 is larger than the amount of aluminum the first aluminum oxide layer 28 side of the silicon oxide layer 30. In addition, it is also preferable that the amount of silicon in the second aluminum oxide layer 32 is larger than the amount of silicon in the first aluminum oxide layer 28.

With the above configuration, the size of the second fixed dipole becomes larger than the size of the first fixed dipole. Therefore, the increase in threshold voltage of the HEMT becomes large, and thus, the decrease in threshold voltage of the HEMT caused by providing the first aluminum oxide layer 28 can be allowed to be converted into the increase in threshold voltage.

In addition, it is preferable that the thickness of the second aluminum oxide layer 32 is larger than the thickness of the first aluminum oxide layer 28. By increasing the thickness of the second aluminum oxide layer 32 it is possible to allow the amount of aluminum on the second aluminum oxide layer 32 side of the silicon oxide layer 30 to be larger than the amount of aluminum on the first aluminum oxide layer 28 side of the silicon oxide layer 30. Therefore, the size of the second fixed dipole can be allowed to be larger than the size of the first fixed dipole. Therefore, it is possible to allow the decrease in threshold voltage of the HEMT caused by the providing of first aluminum oxide layer 28 to be converted into the increase in threshold voltage.

In addition, it is preferable that a region having a concentration of aluminum of $1 \times 10^{16}$ cm$^{-3}$ or less exists in the silicon oxide layer 30. If the concentration of aluminum in the silicon oxide layer 30 is too high, the reliability of the HEMT may be deteriorated.

In addition, in the HEMT according to the embodiment, the energy of the upper end of the valence band of the first aluminum oxide layer 28 and the second aluminum oxide layer 32 is larger than the energy of the upper end of the valence band of the silicon oxide layer 30. Therefore, the barrier against the holes directed from the gate electrode 24 to the barrier layer 16 also becomes large. Therefore, the holes are injected into the barrier layer 16 when the HEMT is in ON operation, it is possible to suppress a bipolar operation of the HEMT.

As described above, with the HEMT according to the third embodiment, it is possible to suppress the current collapse similarly to the first embodiment. Furthermore, it is possible to suppress the decrease in threshold voltage of the HEMT caused by providing the first aluminum oxide layer 28, and the realization of the normally-off operation is facilitated. The gate leakage current between the gate electrode 24 and the barrier layer 16 is reduced.

Fourth Embodiment

A semiconductor device according to the embodiment is the same as that of the second embodiment except that a first aluminum oxide layer, a silicon oxide layer, and a second aluminum oxide layer are provided between the first nitride semiconductor layer and the gate electrode. In addition, the semiconductor device according to the embodiment is different from that of the third embodiment in that the first aluminum oxide layer contains at least one first element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and the second aluminum oxide layer contains at least one second element selected from a group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N). Hereinafter, description of redundant contents of the second and third embodiments will be omitted.

Figure 22:
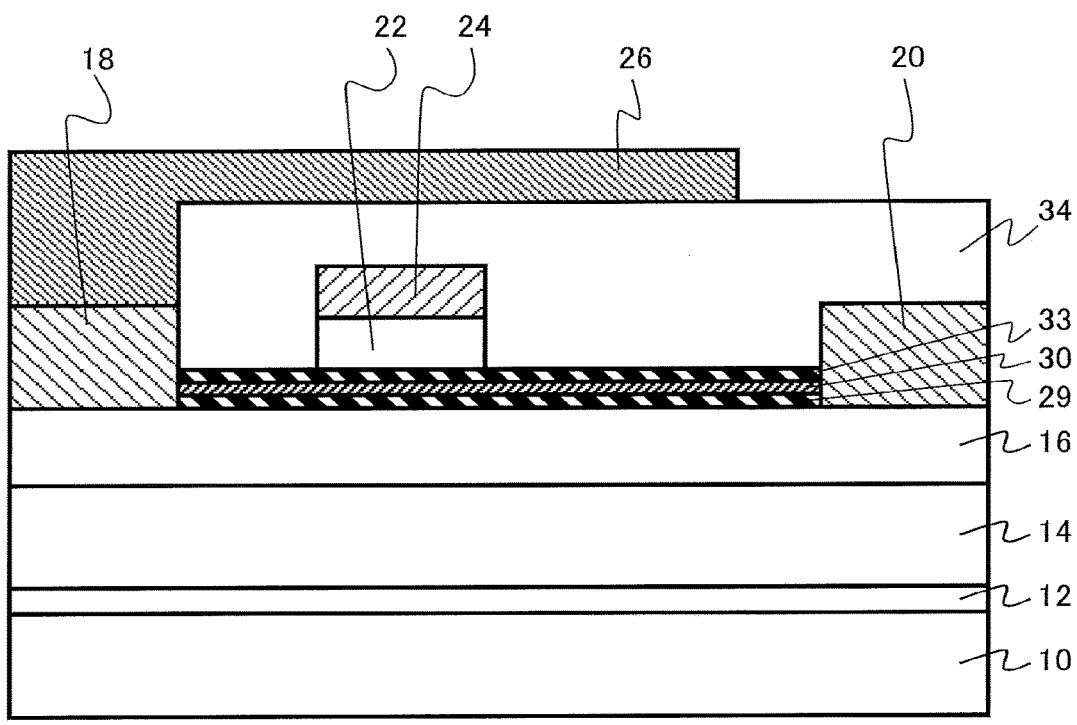
FIG. 22 is a schematic cross-sectional diagram of a semiconductor device according to a fourth embodiment.

FIG. 22 is a schematic cross-sectional diagram of the semiconductor device according to the embodiment. The semiconductor device according to the embodiment is an HEMT using a GaN-based semiconductor.

As illustrated in FIG. 22, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), a drain electrode 20 (second electrode), a p-type layer 22, a gate electrode 24, a source field plate 26 (conductive layer), a first aluminum oxide layer 29, a silicon oxide layer 30, a second aluminum oxide layer 33, and a protective film 34.

The first aluminum oxide layer 29, the silicon oxide layer 30, and the second aluminum oxide layer 33 are provided between the barrier layer 16 and the gate electrode 24. The first aluminum oxide layer 29, the silicon oxide layer 30, and the second aluminum oxide layer 33 are provided between the barrier layer 16 and the p-type layer 22.

The p-type layer 22 has a function of increasing the threshold voltage of the HEMT. The p-type layer 22 is made of, for example, polycrystalline p-type GaN.

Next, the function and effect of the semiconductor device according to the embodiment will be described.

Similarly to the second embodiment, in the HEMT according to the fourth embodiment, it is possible to suppress the current collapse in which the on-resistance increases when a high drain voltage is applied. Furthermore, similarly to the third embodiment, it is possible to suppress a decrease in threshold voltage of the HEMT caused by providing the first aluminum oxide layer 29 serving as a barrier against diffusion of gallium Furthermore, it is possible to invert and increase the threshold voltage.

In the HEMT according to the embodiment, as the first elements as impurities are added to the first aluminum oxide layer 29, it is possible to suppress the crystallization of the first aluminum oxide layer 29. In addition, as the second elements as impurities are added to the second aluminum oxide layer 33, it is possible to suppress the crystallization of the second aluminum oxide layer 33. Therefore, it is possible to further suppress the current collapse as compared with the third embodiment.

Figure 23:
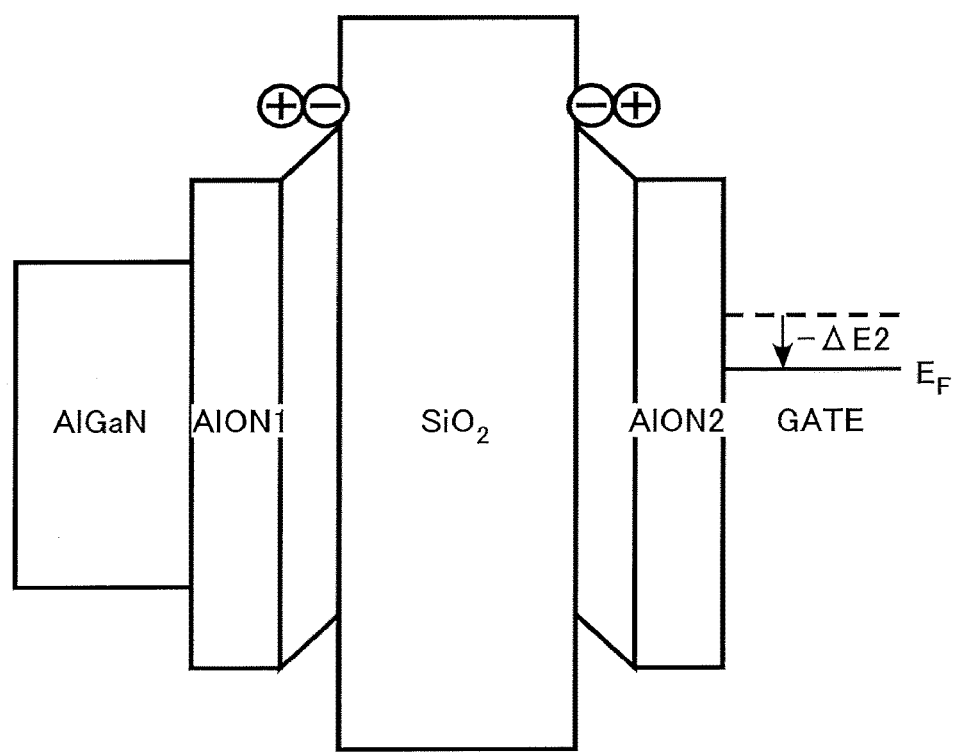
FIG. 23 is an explanatory view of the function and effect of the semiconductor device according to the fourth embodiment.

FIG. 23 is an explanatory diagram of the function and effect of the semiconductor device according to the embodiment. FIG. 23 illustrates an energy band diagram in the case of the HEMT according to the embodiment. Namely, the figure illustrates an energy band diagram of the barrier layer 16 (corresponding to "AlGaN" in FIG. 23), the first aluminum oxide layer 29 (corresponding to "AlON1" in FIG. 23), the silicon oxide layer 30 (corresponding to "SiO$_2$" in FIG. 23), the second aluminum oxide layer 33 (corresponding to "AlON2" in FIG. 23), and the gate electrode 24 (corresponding to "GATE" in FIG. 23). In FIG. 23, the p-type layer 22 is omitted. In addition, it is assumed that the gate electrode 24 is made of a metal.

A first fixed dipole is formed between the first aluminum oxide layer 29 and the silicon oxide layer 30, and a second fixed dipole is formed between the silicon oxide layer 30 and the second aluminum oxide layer 33. The second fixed dipole is provided, so that the Fermi level ("$E_F$" in FIG. 23) of the gate electrode 24 is shifted by $-\Delta E2$ as compared with the case where the second aluminum oxide layer 33 does not exist, and the effective work function of the gate electrode 24 increases. Therefore, the threshold voltage of the HEMT increases as compared with the case where the second aluminum oxide layer 33 does not exist. Therefore, it is possible to suppress a decrease in threshold voltage of the HEMT caused by providing the first aluminum oxide layer 29, and furthermore, it is possible to invert and increase the threshold voltage.

A divalent element and a pentavalent element facilitate the diffusion of aluminum in an aluminum oxide. Therefore, from the viewpoint of increasing the size of the second fixed dipole, it is preferable that magnesium (Mg), calcium (Ca), strontium (Sr), or barium (Ba) which is a divalent element or nitrogen (N) which is a pentavalent element is used for the second element. It is considered that the pentavalent element and the divalent element form the oxygen deficiencies in an aluminum oxide, so that the bond between oxygen and aluminum which is a trivalent element is weakened to facilitate the diffusion of aluminum.

From the viewpoint of facilitating the production of the HEMT, it is preferable that the same element is used for the first element and the second element. In a case where the same divalent or pentavalent element is used for the first element and the second element, from the viewpoint of allowing the size of the second fixed dipole to be larger than the size of the first fixed dipole, it is preferable that the concentration of the second element in the second aluminum oxide layer 33 is higher than the concentration of the first element in the first aluminum oxide layer 29.

For example, in a case where the first element and the second element are nitrogen, it is preferable that the concentration of nitrogen in the second aluminum oxide layer 33 is higher than the concentration of nitrogen in the first aluminum oxide layer 29. Due to the high concentration of nitrogen in the second aluminum oxide layer 33, the diffusion of aluminum is facilitated. Thus, the amount of aluminum on the second aluminum oxide layer 33 side of the silicon oxide layer 30 is larger than the amount of aluminum on the first aluminum oxide layer 29 side of the silicon oxide layer 30. Therefore, the size of the second fixed dipole becomes larger than the size of the first fixed dipole. Therefore, the threshold voltage of the HEMT further increases.

From the viewpoint of suppressing the diffusion of aluminum and reducing the size of the first fixed dipole on the first aluminum oxide layer 29 side, it is preferable that boron (B), gallium (Ga), scandium (Sc), yttrium (Y), or a lanthanoid (La, Ce, Pr, Nd, Pm, Sm, Eu, Gd, Tb, Dy, Ho, Er, Tm, Yb, or Lu) which is a trivalent element is used for the first element. It is considered that the trivalent element suppresses diffusion of aluminum because the element does not form oxygen deficiencies in an aluminum oxide.

On the other hand, the trivalent element itself together with silicon forms a fixed dipole. Therefore, in order to adjust the size of the fixed dipole, it is necessary to optimize the amount of trivalent elements and the temperature and time of heat treatment.

As described above, with the HEMT according to the embodiment, it is possible to further suppress the current collapse as compared with the third embodiment. Furthermore, it is possible to suppress the decrease in threshold voltage of the HEMT caused by providing the first aluminum oxide layer 28, and the realization of the normally-off operation is facilitated.

Fifth Embodiment

The semiconductor device according to the embodiment is the same as that of the fourth embodiment except that an aluminum nitride layer is further provided between the second aluminum oxide layer and the gate electrode. Hereinafter, description of redundant contents of the fourth embodiment will be omitted.

Figure 24:
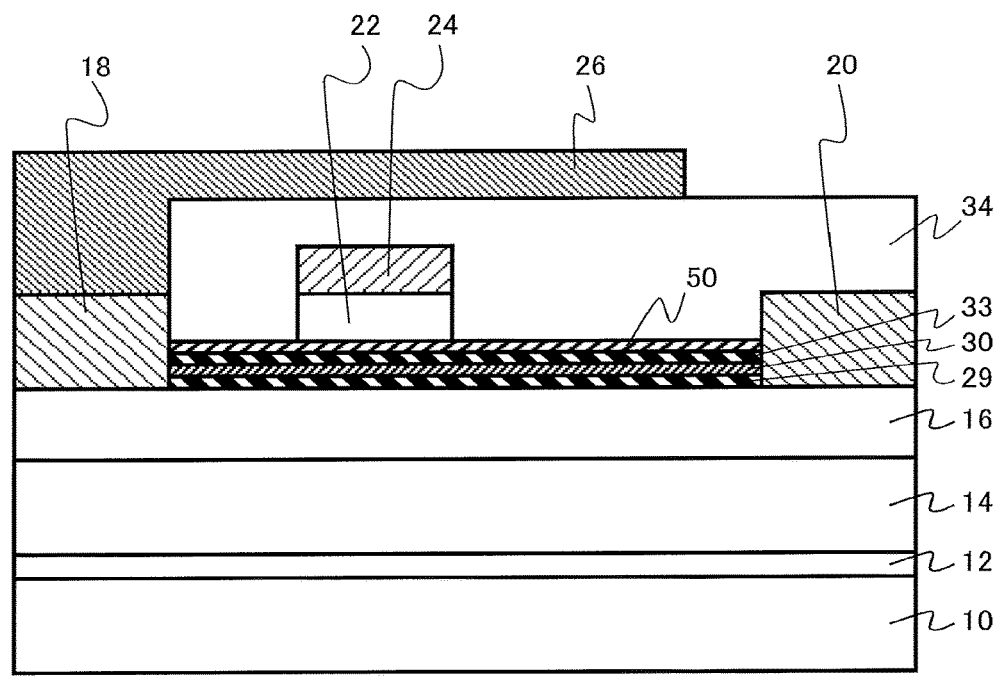
FIG. 24 is a schematic cross-sectional diagram of a semiconductor device according to a fifth embodiment.

FIG. 24 is a schematic cross-sectional diagram of the semiconductor device according to the embodiment. The semiconductor device according to the embodiment is an HEMT using a GaN-based semiconductor.

As illustrated in FIG. 24, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), a drain electrode 20 (second electrode), a p-type layer 22, a gate electrode 24, source field plate 26 (conductive layer), a first aluminum oxide layer 28, a silicon oxide layer 30, a second aluminum oxide layer 32, a protective film 34, and an aluminum nitride layer 50.

The aluminum nitride layer 50 is provided between the second aluminum oxide layer 33 and the gate electrode 24. The aluminum nitride layer 50 is provided between the second aluminum oxide layer 33 and the p-type layer 22.

The thickness of the aluminum nitride layer 50 is, for example, 1 nm or more and 5 nm or less.

In the HEMT according to the embodiment, the aluminum nitride layer 50 is provided, so that it is possible to prevent the oxidation of the p-type layer 22 and the gate electrode 24. Therefore, it is possible to suppress fluctuation in characteristics of the HEMT caused by the oxidation of the p-type layer 22 and the gate electrode 24.

In addition, it is possible to obtain the same effect when the second element contained in the second aluminum oxide layer 32 is nitrogen and the concentration of nitrogen at the end portion of the gate electrode 24 side of the second aluminum oxide layer 33 is higher than the concentration of nitrogen at the center of the second aluminum oxide layer 33.

As described above, with the HEMT according to the fifth embodiment, it is possible to suppress the current collapse similarly to the fourth embodiment. Furthermore, it is possible to suppress the fluctuation in characteristics of the HEMT due to the oxidation of the p-type layer 22 or the gate electrode 24.

Sixth Embodiment

The semiconductor device according to the embodiment is the same as the first embodiment except that the semiconductor device further includes a gate field plate. Hereinafter, description of redundant contents of the first embodiment will be omitted.

Figure 25:
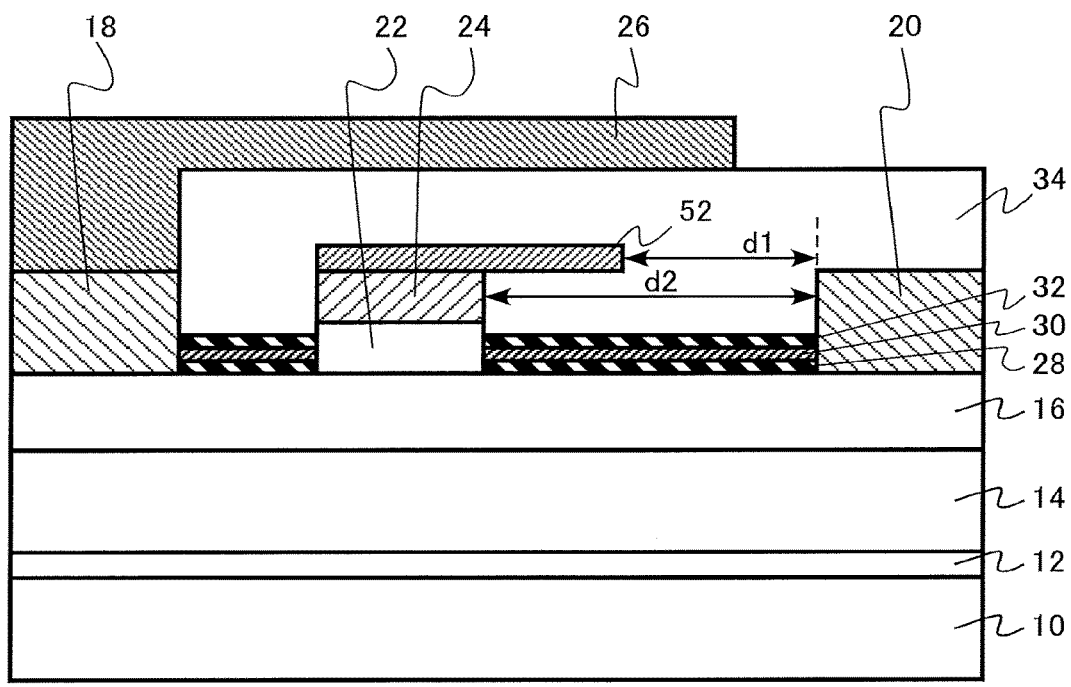
FIG. 25 is a schematic cross-sectional diagram of a semiconductor device according to a sixth embodiment.

FIG. 25 is a schematic cross-sectional diagram of the semiconductor device according to the embodiment. The semiconductor device according to the embodiment is an HEMT using a GaN-based semiconductor.

As illustrated in FIG. 25, the HEMT according to the embodiment is configured to include a substrate 10, a buffer layer 12, a channel layer 14 (first nitride semiconductor layer), a barrier layer 16 (second nitride semiconductor layer), a source electrode 18 (first electrode), drain electrode 20 (second electrode), a p-type layer 22, a gate electrode 24, a source field plate 26 (conductive layer), a first aluminum oxide layer 28, a silicon oxide layer 30, a second aluminum oxide layer 32, a protective film 34, and a gate field plate 52 (conductive layer).

The gate field plate 52 is provided on the barrier layer 16. A first distance ("d1" in FIG. 25) in the horizontal direction between the drain electrode 20 and the gate field plate 52 is smaller than a second distance ("d2" in FIG. 25) in the horizontal direction between the drain electrode 20 and the gate electrode 24. In other words, the end portion of the drain electrode 20 side of the gate field plate 52 is located between the gate electrode 24 and the drain electrode 20.

The gate field plate 52 is physically and electrically connected to the gate electrode 24. The gate field plate 52 has a function of alleviating an electric field of the time when a high drain voltage is applied and suppressing the current collapse.

The gate field plate 52 is, for example, a metal electrode, and the gate field plate 52 is made of, for example, titanium nitride (TiN).

In the HEMT according to the embodiment, the gate field plate 52 is provided in addition to the source field plate 26, so that the electric field of the time when a high drain voltage is applied is further alleviated. Therefore, it is possible to further suppress the current collapse as compared with the first embodiment.

Seventh Embodiment

The semiconductor device according to the embodiment is different from that of the third embodiment in that the semiconductor device has a so-called gate recess structure in which a gate electrode is buried in a groove (recess) formed in the channel layer 14 and the barrier layer 16, and the semiconductor device has no p-type layer. Therefore, description of redundant contents of the third embodiment will be omitted.

Figure 26:
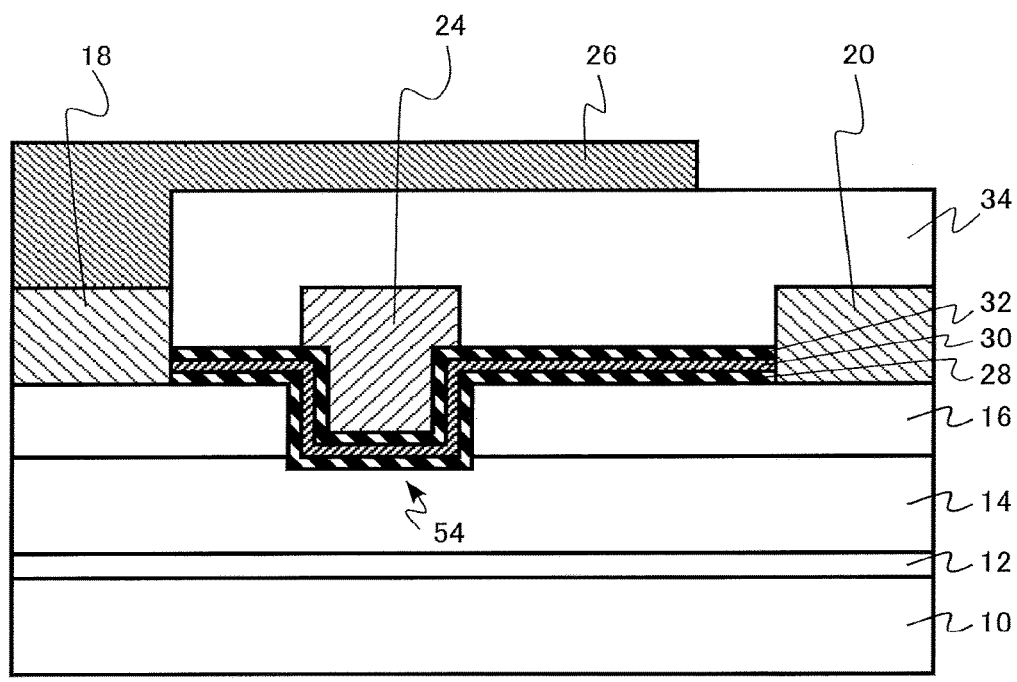
FIG. 26 is a schematic cross-sectional diagram of a semiconductor device according to a seventh embodiment.

FIG. 26 is a schematic cross-sectional diagram of the semiconductor device according to the embodiment.

As illustrated in FIG. 26, in the HEMT according to the embodiment, the first aluminum oxide layer 28, the silicon oxide layer 30, and the second aluminum oxide layer 32 are formed on an inner surface of a groove 54 (recess) provided in the channel layer 14 and the barrier layer 16 between the source electrode 18 and the drain electrode 20. The bottom of the groove 54 is located in the channel layer 14. The gate electrode 24 is also provided in the groove 54. The gate electrode 24 is in contact with the second aluminum oxide layer 32.

Similarly to the third embodiment, with the semiconductor device according to the seventh embodiment, it is possible to realize the suppression of current collapse and the increase in threshold voltage. In addition, the gate recess structure is provided, so that the threshold voltage further increases and the realization of the normally-off operation is facilitated.

Eighth Embodiment

A semiconductor device according to the embodiment is the same as that of the seventh embodiment except that a p-type layer 22 is provided. Therefore, description of redundant contents of the seventh embodiment will be omitted.

Figure 27:
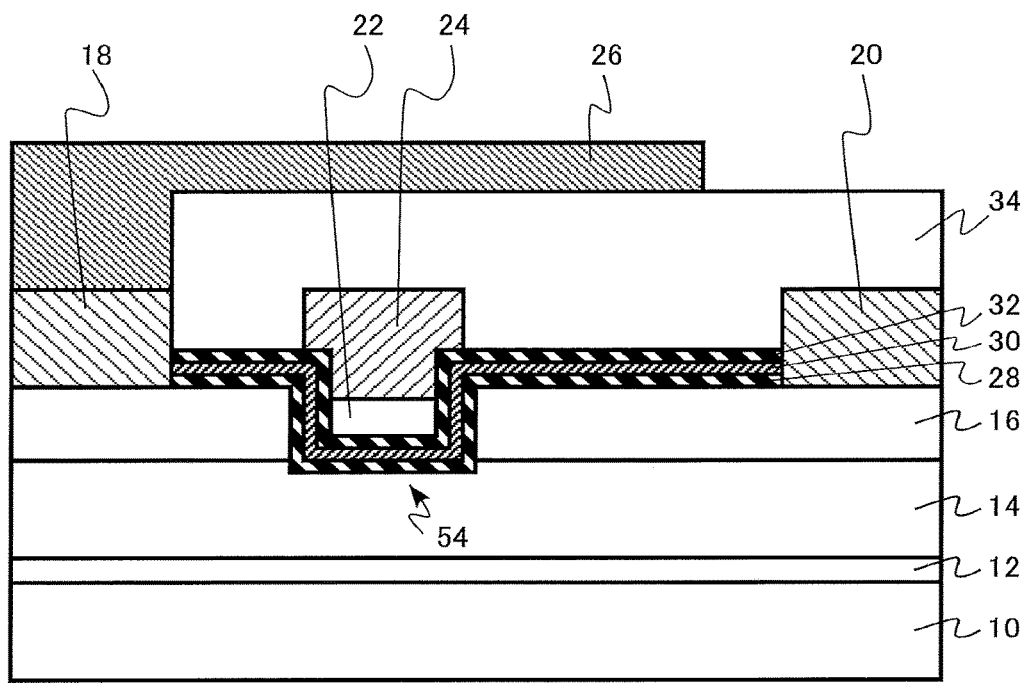
FIG. 27 is a schematic cross-sectional diagram of a semiconductor device according to an eighth embodiment.

FIG. 27 is a schematic cross-sectional diagram of the semiconductor device according to the embodiment.

As illustrated in FIG. 27, in the HEMT according to the embodiment, the first aluminum oxide layer 28, the silicon oxide layer 30, and the second aluminum oxide layer 32 are formed on the inner surface of the groove 54 (recess) provided in the channel layer 14 and the barrier layer 16 between the source electrode 18 and the drain electrode 20. The bottom of the groove 54 is located in the channel layer 14. The gate electrode 24 is also provided in the groove 54. The p-type layer 22 is provided between the gate electrode 24 and the second aluminum oxide layer 32.

Similarly to the seventh embodiment, with the semiconductor device according to the eighth embodiment, it is possible to realize the suppression of current collapse and the increase in threshold voltage. In addition, the p-type layer 22 is provided, so that the threshold voltage further increases, and the realization of the normally-off operation is facilitated.

Ninth Embodiment

A semiconductor device according to the embodiment is different from that of the first embodiment in that the semiconductor device has a so-called gate recess structure in which a p-type layer is buried in the groove (recess) formed in the barrier layer 16. Therefore, description of redundant contents of the first embodiment will be omitted.

Figure 28:
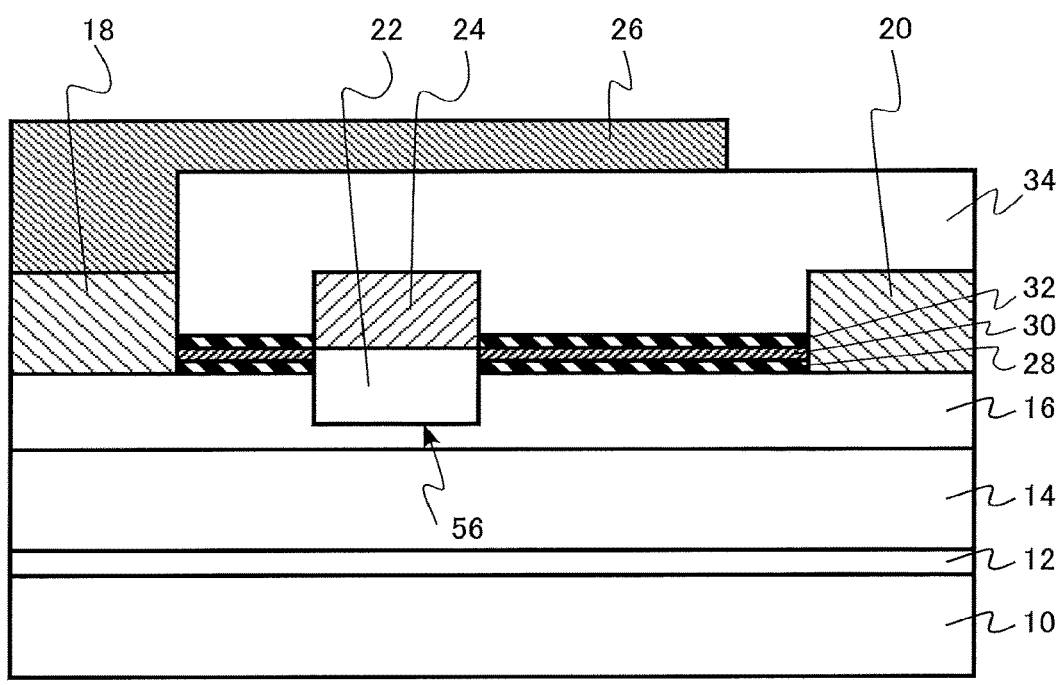
FIG. 28 is a schematic cross-sectional diagram of a semiconductor device according to a ninth embodiment.

FIG. 28 is a schematic cross-sectional diagram of the semiconductor device according to the embodiment.

As illustrated in FIG. 28, in the HEMT according to the embodiment, the p-type layer 22 is provided on the inner surface of the groove 56 (recess) provided in the barrier layer 16 between the source electrode 18 and the drain electrode 20.

Similarly to the first embodiment, with the semiconductor device according to the ninth embodiment, it is possible to realize the suppression of current collapse. In addition, the gate recess structure is provided, so that the threshold voltage increases, and the realization of the normally-off operation is facilitated.

Tenth Embodiment

A semiconductor device according to the embodiment is the same as that of the ninth implementation except that the first aluminum oxide layer 28, the silicon oxide layer 30, and the second aluminum oxide layer 32 are provided between the barrier layer 16 and the p-type layer 22. Therefore, description of redundant contents of the ninth embodiment will be omitted.

Figure 29:
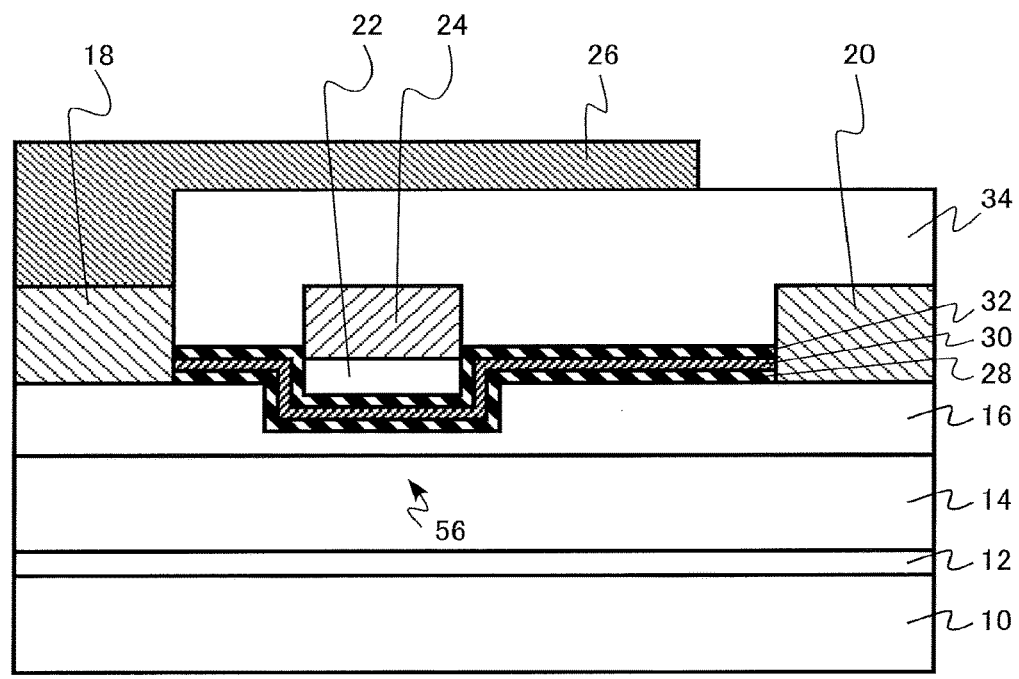
FIG. 29 is a schematic cross-sectional diagram of a semiconductor device according to a tenth embodiment.

FIG. 29 is a schematic cross-sectional diagram of the semiconductor device according to the embodiment.

As illustrated in FIG. 29, in the HEMT according to the embodiment, the p-type layer 22 is provided on the inner surface of the groove 56 (recess) provided in the barrier layer 16 between the source electrode 18 and the drain electrode 20. The first aluminum oxide layer 28, the silicon oxide layer 30, and the second aluminum oxide layer 32 are provided between the barrier layer 16 and the p-type layer 22.

Similarly to the ninth embodiment, with the semiconductor device according to the tenth embodiment, it is possible to realize the suppression of current collapse. In addition, the gate recess structure is provided, so that the threshold voltage increases, and the realization of the normally-off operation is facilitated. In addition, the first aluminum oxide layer 28, the silicon oxide layer 30, and the second aluminum oxide layer 32 are provided, so that the gate leakage current between the gate electrode 24 and the barrier layer 16 is reduced.

Eleventh Embodiment

A semiconductor device according to the embodiment is different from that of the third embodiment in that a buried p-type layer is provided in the channel layer and a p-type layer is not provided between the barrier layer and the gate electrode. Therefore, description of redundant contents of the third embodiment will be omitted.

Figure 30:
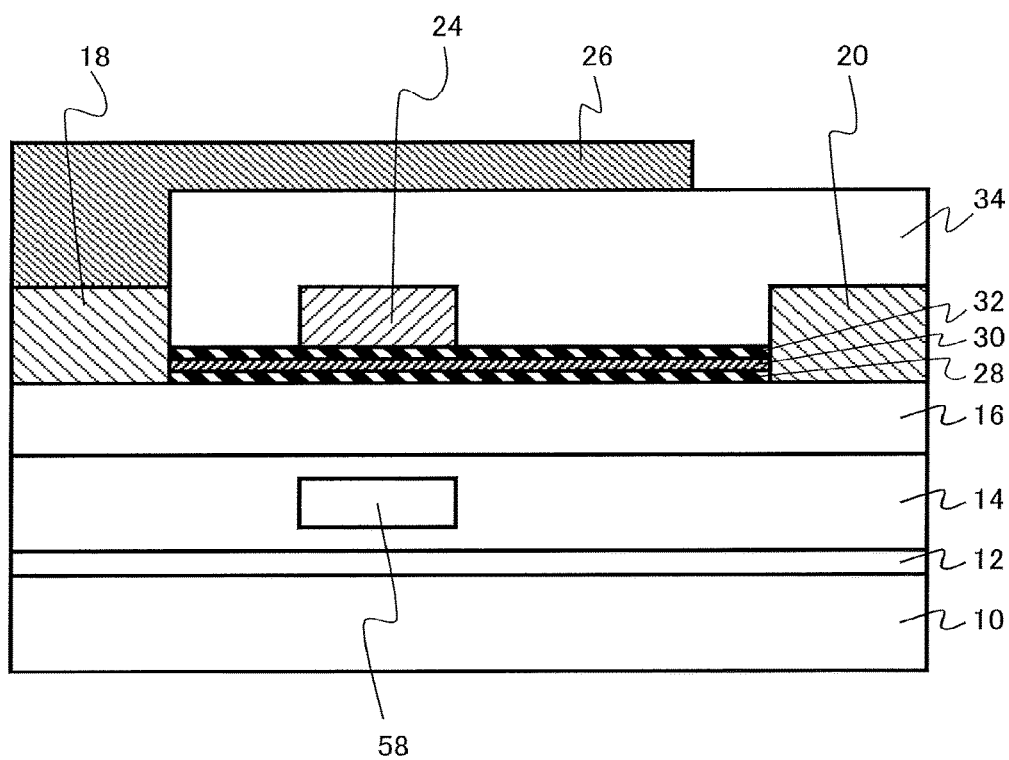
FIG. 30 is a schematic cross-sectional diagram of a semiconductor device according to an eleventh embodiment.

FIG. 30 is a schematic cross-sectional diagram of the semiconductor device according to the embodiment.

As illustrated in FIG. 30, in the HEMT according to the embodiment, a buried p-type layer is provided in the channel layer 14. The buried p-type layer is formed by, for example, ion-implanting magnesium (Mg).

Similarly to the third embodiment, with the semiconductor device according to the eleventh embodiment, it is possible to realize the suppression of current collapse and the increase in threshold voltage. In addition, the buried p-type layer is provided, so that it is possible to increase the threshold voltage.

Twelfth Embodiment

A semiconductor device according to the embodiment is different from that of the third embodiment in that it is a vertical HEMT. The first aluminum oxide layer 28, the silicon oxide layer 30, and the second aluminum oxide layer 32 are the same as those of the first embodiment and the third embodiment. Hereinafter, description of redundant contents of the first embodiment and the third embodiment will be omitted.

Figure 31:
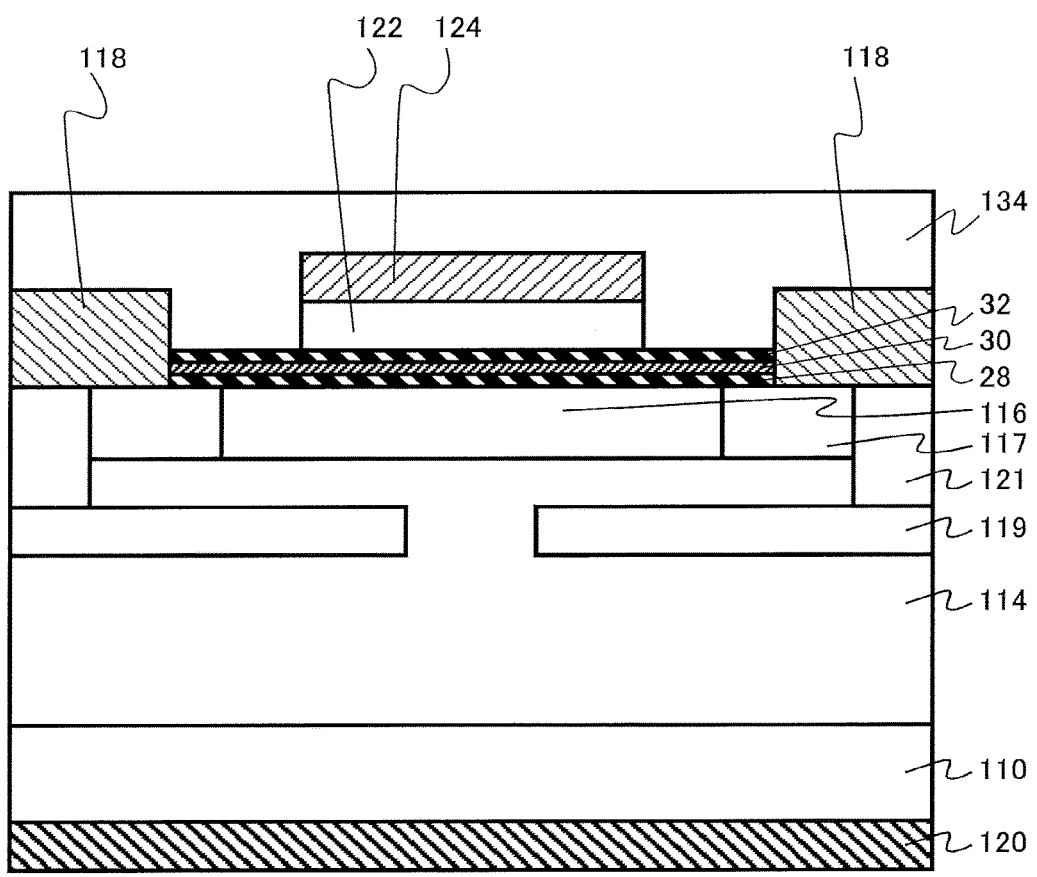
FIG. 31 is a schematic cross-sectional diagram of a semiconductor device according to a twelfth embodiment.

FIG. 31 is a schematic cross-sectional diagram of the semiconductor device according to the embodiment. The semiconductor device according to the embodiment is a vertical HEMT using a GaN-based semiconductor.

As illustrated in FIG. 31, the HEMT according to the embodiment is configured to include a substrate 110, a channel layer 114, a barrier layer 116, a source region 117, a p-type blocking region 119, a p-type contact region 121, a source electrode 118, a drain electrode 120, a p-type layer 122, a gate electrode 124, a first aluminum oxide layer 28, a silicon oxide layer 30, a second aluminum oxide layer 32, and a protective film 134.

The substrate 110 is made of, for example, n-type GaN. The channel layer 114 is made of, for example, n-type $Al_XGa_{1-X}N$ (0≤X<1) having a lower concentration than the substrate 110. The barrier layer 116 is made of, for example, undoped $Al_YGa_{1-Y}N$ (0<Y≤1, X<Y). The source region 117 is made of, for example, n-type $Al_YGa_{1-Y}N$ (0<Y≤1, X<Y). The p-type blocking region 119 is made of, for example, p-type GaN. The p-type contact region 121 is made of, for example, p-type $Al_ZGa_{1-Z}N$ (0≤Z<1).

In the HEMT according to the embodiment, the ON state and OFF state of the current flowing from the source electrode 118 to the drain electrode 120 are controlled by the gate voltage applied to the gate electrode 124.

The p-type blocking region 119 has a function of blocking the current by depleting the space between the two p-type blocking regions 119 in the OFF state. The p-type blocking region 119 can be formed by, for example, removing a portion of p-type GaN formed by epitaxial growth by etching.

The p-type contact region 121 has a function of electrically connecting the source electrode 118 and the p-type blocking region 119. The p-type contact region 121 can be formed by, for example, ion-implanting magnesium (Mg) and hydrogen (H).

For example, a source field plate (not illustrated) may be provided on the barrier layer 116 and the source region 117. In addition, a gate field plate (not illustrated) may be provided on the source region 117. In addition, the source region 117 may overlap the gate electrode 124.

Similarly to the third embodiment, with the semiconductor device according to the twelfth embodiment, suppression of current collapse and increase in threshold voltage can be realized. In addition, the HEMT is configured as a vertical HEMT, so that it is possible to increase the ON current per unit area.

Thirteenth Embodiment

A power supply circuit and a computer according to the embodiment include the HEMT according to the first to eleventh embodiments.

Figure 32:
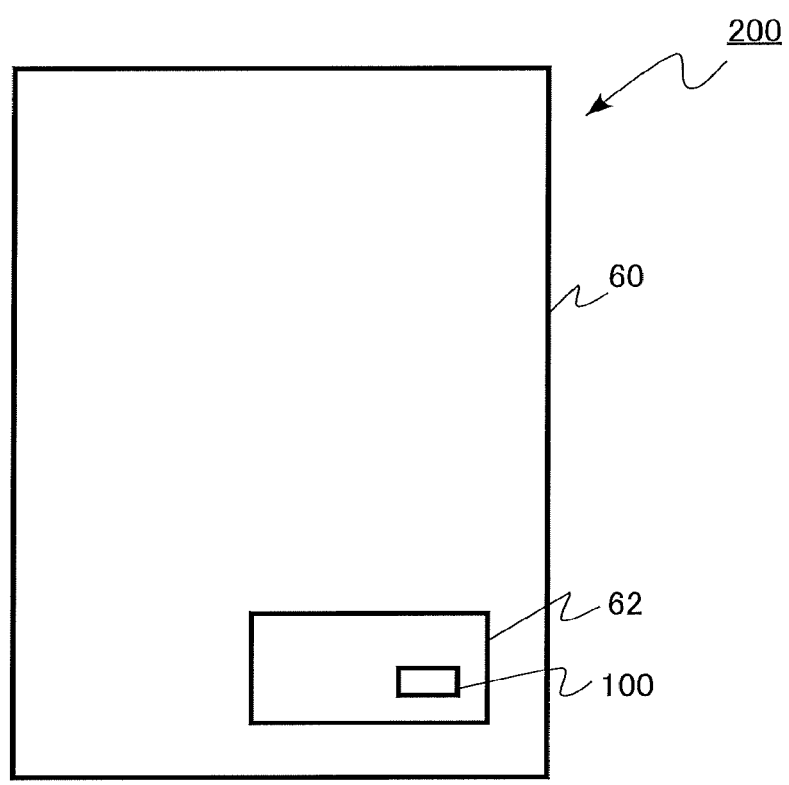
FIG. 32 is a schematic diagram of a computer according to a thirteenth embodiment.

FIG. 32 is a schematic diagram of the computer according to the embodiment. The computer according to the embodiment is, for example, a server 200.

The server 200 is configured to include a power supply circuit 62 in a casing 60. The server 200 is a computer that runs server software. The power supply circuit 62 includes the HEMT 100 according to the first to ninth embodiments.

The power supply circuit 62 includes the HEMT 100 in which the current collapse is suppressed, so that the power supply circuit has high reliability. In addition, the server 200 includes the power supply circuit 62, so that the server has high reliability.

According to the embodiment, it is possible to realize a power supply circuit and a computer with high reliability.

In the embodiments, GaN and AlGaN are described as examples of the material of the GaN-based semiconductor layer, but for example, InGaN, InAlN, and InAlGaN containing indium (In) may be applied. In addition, AlN may be used for the material of the GaN-based semiconductor layer.

In the embodiments, undoped AlGaN is described as an example of the barrier layer 16, but n-type AlGaN may be applied.

While certain embodiments have been described, these embodiments have been presented by way of example only, and are not intended to limit the scope of the inventions. Indeed, semiconductor devices, power supply circuits, computers, and methods of manufacturing a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer containing gallium (Ga);
   a second nitride semiconductor layer provided on the first nitride semiconductor layer, the second nitride semiconductor layer having a band gap larger than that of the first nitride semiconductor layer, and the second nitride semiconductor layer containing gallium (Ga);
   a first electrode provided on or above the first nitride semiconductor layer, and the first electrode electrically connected to the first nitride semiconductor layer;
   a second electrode provided on or above the first nitride semiconductor layer, and the second electrode electrically connected to the first nitride semiconductor layer;
   a gate electrode provided between the first electrode and the second electrode, and the gate electrode provided on or above the first nitride semiconductor layer;
   a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;
   a first aluminum oxide layer provided between the second nitride semiconductor layer and the conductive layer, and provided between the gate electrode and the second electrode;
   a silicon oxide layer provided between the first aluminum oxide layer and the conductive layer; and
   a second aluminum oxide layer provided between the silicon oxide layer and the conductive layer,
   wherein a region having a concentration of aluminum of $1\times10^{16}$ cm$^{-3}$ or less exists in the silicon oxide layer.

2. The semiconductor device according to claim 1,
   wherein the first aluminum oxide layer contains at least one first element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and
   wherein the second aluminum oxide layer contains at least one second element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N).

3. The semiconductor device according to claim 2,
   wherein a concentration of the at least one first element in the first aluminum oxide layer is 10% or more of a concentration of aluminum, and
   wherein a concentration of the at least one second element in the second aluminum oxide layer is 10% or more of a concentration of aluminum.

4. The semiconductor device according to claim 1,
   wherein the first aluminum oxide layer contains at least one first element selected from the group consisting of magnesium (Mg), calcium (Ca), strontium (Sr), barium (Ba), and nitrogen (N), and wherein the first aluminum oxide layer contains at least one third element selected from the group consisting of fluorine (F), hydrogen (H), and deuterium (D).

5. The semiconductor device according to claim 4, wherein a concentration of the at least one first element at a first position in the first aluminum oxide layer is 80% or more and 120% or less of a concentration of the at least one third element at the first position.

6. The semiconductor device according to claim 1, wherein the second aluminum oxide layer contains at least one second element selected from the group consisting of magnesium (Mg), calcium (Ca), strontium (Sr), barium (Ba), and nitrogen (N), and wherein the second aluminum oxide layer contains at least one fourth element selected from the group consisting of fluorine (F), hydrogen (H), and deuterium (D).

7. The semiconductor device according to claim 6, wherein a concentration of the at least one second element at a second position in the second aluminum oxide layer is 80% or more and 120% or less of a concentration of the at least one fourth element at the second position.

8. The semiconductor device according to claim 1, wherein the first aluminum oxide layer, the silicon oxide layer, and the second aluminum oxide layer are provided between the first nitride semiconductor layer and the gate electrode.

9. The semiconductor device according to claim 1, wherein a thickness of the second aluminum oxide layer is larger than a thickness of the first aluminum oxide layer.

10. A power supply circuit comprising the semiconductor device according to claim 1.

11. A computer comprising the semiconductor device according to claim 1.

12. The semiconductor device according to claim 1, wherein the first aluminum oxide layer contains at least one first element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), wherein the second aluminum oxide layer contains at least one second element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and wherein the at least one first element and the at least one second element are nitrogen, and concentration of nitrogen in the second aluminum oxide layer is higher than concentration of nitrogen in the first aluminum oxide layer.

13. The semiconductor device according to claim 1, wherein the first aluminum oxide layer contains at least one first element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), wherein the second aluminum oxide layer contains at least one second element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), wherein a concentration of the at least one first element in the silicon oxide layer is lower than a concentration of the at least one first element in the first aluminum oxide layer, and wherein a concentration of the at least one second element in the silicon oxide layer is lower than a concentration of the at least one second element in the second aluminum oxide layer.

14. The semiconductor device according to claim 1, wherein the silicon oxide layer includes aluminum, an amount of aluminum on the second aluminum oxide layer side of the silicon oxide layer is larger than an amount of aluminum on the first aluminum oxide layer side of the silicon oxide layer.

15. The semiconductor device according to claim 1, wherein the first aluminum oxide layer and the second aluminum oxide layer include silicon, an amount of silicon in the second aluminum oxide layer is larger than an amount of silicon in the first aluminum oxide layer.

16. A semiconductor device comprising:

a first nitride semiconductor layer containing gallium (Ga);

a second nitride semiconductor layer provided on the first nitride semiconductor layer, the second nitride semiconductor layer having a band gap larger than that of the first nitride semiconductor layer, and the second nitride semiconductor layer containing gallium (Ga);

a first electrode provided on or above the first nitride semiconductor layer, and the first electrode electrically connected to the first nitride semiconductor layer;

a second electrode provided on or above the first nitride semiconductor layer, and the second electrode electrically connected to the first nitride semiconductor layer;

a gate electrode provided between the first electrode and the second electrode, and the gate electrode provided on or above the first nitride semiconductor layer;

a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;

a first aluminum oxide layer provided between the second nitride semiconductor layer and the conductive layer, and provided between the gate electrode and the second electrode, a silicon oxide layer provided between the first aluminum oxide layer and the conductive layer; and a second aluminum oxide layer provided between the silicon oxide layer and the conductive layer, wherein the first aluminum oxide layer contains at least one first element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), wherein the second aluminum oxide layer contains at least one second element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and wherein the at least one first element and the at least one second element are nitrogen, and concentration of nitrogen in the second aluminum oxide layer is higher than concentration of nitrogen in the first aluminum oxide layer.

17. The semiconductor device according to claim 16, wherein the first aluminum oxide layer, the silicon oxide layer, and the second aluminum oxide layer are provided between the first nitride semiconductor layer and the gate electrode.

18. A semiconductor device comprising:
a first nitride semiconductor layer containing gallium (Ga);
a second nitride semiconductor layer provided on the first nitride semiconductor layer, the second nitride semiconductor layer having a band gap larger than that of the first nitride semiconductor layer, and the second nitride semiconductor layer containing gallium (Ga);
a first electrode provided on or above the first nitride semiconductor layer, and the first electrode electrically connected to the first nitride semiconductor layer;
a second electrode provided on or above the first nitride semiconductor layer, and the second electrode electrically connected to the first nitride semiconductor layer;
a gate electrode provided between the first electrode and the second electrode, and the gate electrode provided on or above the first nitride semiconductor layer;
a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;
a first aluminum oxide layer provided between the second nitride semiconductor layer and the conductive layer, and provided between the gate electrode and the second electrode;
a silicon oxide layer provided between the first aluminum oxide layer and the conductive layer; and
a second aluminum oxide layer provided between the silicon oxide layer and the conductive layer,
wherein the first aluminum oxide layer contains at least one first element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N),
wherein the second aluminum oxide layer contains at least one second element selected from the group consisting of boron (B), gallium (Ga), scandium (Sc), yttrium (Y), lanthanoids (La, Ce, Pr, Nd, Pm, Sm, Eu, Gd, Tb, Dy, Ho, Er, Tm, Yb, and Lu), magnesium (Mg), calcium (Ca), strontium (Sr), barium (Ba), and nitrogen (N), and
wherein a concentration of the at least one first element in the silicon oxide layer is lower than a concentration of the at least one first element in the first aluminum oxide layer, and
wherein a concentration of the at least one second element in the silicon oxide layer is lower than a concentration of the at least one second element in the second aluminum oxide layer.

19. The semiconductor device according to claim 18, wherein the first aluminum oxide layer, the silicon oxide layer, and the second aluminum oxide layer are provided between the first nitride semiconductor layer and the gate electrode.

20. A semiconductor device comprising:
a first nitride semiconductor layer containing gallium (Ga);
a second nitride semiconductor layer provided on the first nitride semiconductor layer, the second nitride semiconductor layer having a band gap larger than that of the first nitride semiconductor layer, and the second nitride semiconductor layer containing gallium (Ga);
a first electrode provided on or above the first nitride semiconductor layer, and the first electrode electrically connected to the first nitride semiconductor layer;
a second electrode provided on or above the first nitride semiconductor layer, and the second electrode electrically connected to the first nitride semiconductor layer;
a gate electrode provided between the first electrode and the second electrode, and the gate electrode provided on or above the first nitride semiconductor layer;
a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;
a first aluminum oxide layer provided between the second nitride semiconductor layer and the conductive layer, and provided between the gate electrode and the second electrode;
a silicon oxide layer provided between the first aluminum oxide layer and the conductive layer; and
a second aluminum oxide layer provided between the silicon oxide layer and the conductive layer,
wherein the first aluminum oxide layer, the silicon oxide layer, and the second aluminum oxide layer are provided between the first nitride semiconductor layer and the gate electrode,
the semiconductor device further comprising an aluminum nitride layer between the second aluminum oxide layer and the gate electrode.

21. The semiconductor device according to claim 20, wherein the first aluminum oxide layer contains at least one first element selected from the group consisting of magnesium (Mg), calcium (Ca), strontium (Sr), barium (Ba), and nitrogen (N), and
wherein the first aluminum oxide layer contains at least one third element selected from the group consisting of fluorine (F), hydrogen (H), and deuterium (D).

22. The semiconductor device according to claim 20, wherein the second aluminum oxide layer contains at least one second element selected from the group consisting of magnesium (Mg), calcium (Ca), strontium (Sr), barium (Ba), and nitrogen (N), and
wherein the second aluminum oxide layer contains at least one fourth element selected from the group consisting of fluorine (F), hydrogen (H), and deuterium (D).

23. A semiconductor device comprising:
a first nitride semiconductor layer containing gallium (Ga);
a second nitride semiconductor layer provided on the first nitride semiconductor layer, the second nitride semiconductor layer having a band gap larger than that of the first nitride semiconductor layer, and the second nitride semiconductor layer containing gallium (Ga);
a first electrode provided on or above the first nitride semiconductor layer, and the first electrode electrically connected to the first nitride semiconductor layer;

a second electrode provided on or above the first nitride semiconductor layer, and the second electrode electrically connected to the first nitride semiconductor layer;

a gate electrode provided between the first electrode and the second electrode, and the gate electrode provided on or above the first nitride semiconductor layer;

a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;

a first aluminum oxide layer provided between the second nitride semiconductor layer and the conductive layer, and provided between the gate electrode and the second electrode;

a silicon oxide layer provided between the first aluminum oxide layer and the conductive layer; and a second aluminum oxide layer provided between the silicon oxide layer and the conductive layer, wherein the silicon oxide layer includes aluminum, an amount of aluminum on the second aluminum oxide layer side of the silicon oxide layer is larger than an amount of aluminum on the first aluminum oxide layer side of the silicon oxide layer.

24. The semiconductor device according to claim 23, wherein the first aluminum oxide layer, the silicon oxide layer, and the second aluminum oxide layer are provided between the first nitride semiconductor layer and the gate electrode.

25. A semiconductor device comprising:
a first nitride semiconductor layer containing gallium (Ga);
a second nitride semiconductor layer provided on the first nitride semiconductor layer, the second nitride semiconductor layer having a band gap larger than that of the first nitride semiconductor layer, and the second nitride semiconductor layer containing gallium (Ga);

a first electrode provided on or above the first nitride semiconductor layer, and the first electrode electrically connected to the first nitride semiconductor layer;

a second electrode provided on or above the first nitride semiconductor layer, and the second electrode electrically connected to the first nitride semiconductor layer;

a gate electrode provided between the first electrode and the second electrode, and the gate electrode provided on or above the first nitride semiconductor layer;

a conductive layer provided on or above the second nitride semiconductor layer, and the conductive layer electrically connected to the first electrode or the gate electrode, a first distance between the conductive layer and the second electrode being smaller than a second distance between the gate electrode and the second electrode;

a first aluminum oxide layer provided between the second nitride semiconductor layer and the conductive layer, and provided between the gate electrode and the second electrode;

a silicon oxide layer provided between the first aluminum oxide layer and the conductive layer; and a second aluminum oxide layer provided between the silicon oxide layer and the conductive layer, wherein the first aluminum oxide layer and the second aluminum oxide layer include silicon, an amount of silicon in the second aluminum oxide layer is larger than an amount of silicon in the first aluminum oxide layer.

26. The semiconductor device according to claim 25, wherein the first aluminum oxide layer, the silicon oxide layer, and the second aluminum oxide layer are provided between the first nitride semiconductor layer and the gate electrode.

* * * * *